(12) United States Patent
DaCunha et al.

(10) Patent No.: US 9,041,332 B2
(45) Date of Patent: May 26, 2015

(54) SYSTEM, METHOD AND APPARATUS FOR COMPUTING, MONITORING, MEASURING, OPTIMIZING AND ALLOCATING POWER AND ENERGY FOR A ROD PUMPING SYSTEM

(75) Inventors: Jeffrey J. DaCunha, Flower Mound, TX (US); Richard M. Myers, Grass Valley, CA (US)

(73) Assignee: Long Meadow Technologies, LLC, Flower Mound, TX (US)

( * ) Notice: Subject to any disclaimer, the term of this patent is extended or adjusted under 35 U.S.C. 154(b) by 356 days.

(21) Appl. No.: 13/601,830

(22) Filed: Aug. 31, 2012

(65) Prior Publication Data
US 2013/0127390 A1 May 23, 2013

Related U.S. Application Data

(60) Provisional application No. 61/529,432, filed on Aug. 31, 2011.

(51) Int. Cl.
| | |
|---|---|
| G01R 31/02 | (2006.01) |
| H02P 5/74 | (2006.01) |
| G01R 21/00 | (2006.01) |
| G06F 17/00 | (2006.01) |
| H02P 25/02 | (2006.01) |
| E21B 47/00 | (2012.01) |
| G01R 21/133 | (2006.01) |

(52) U.S. Cl.
CPC *H02P 5/74* (2013.01); *G01R 21/00* (2013.01); *G06F 17/00* (2013.01); *G01R 21/1331* (2013.01); *H02P 25/021* (2013.01); *E21B 47/0008* (2013.01)

(58) Field of Classification Search
USPC ............... 318/490, 650; 700/291, 292, 295; 713/340; 702/61
See application file for complete search history.

(56) References Cited

U.S. PATENT DOCUMENTS

| | | | |
|---|---|---|---|
| 3,610,779 A | 10/1971 | Hubby | |
| 3,824,851 A | 7/1974 | Hagar et al. | |
| 4,102,394 A | 7/1978 | Botts | |

(Continued)

FOREIGN PATENT DOCUMENTS

| | | |
|---|---|---|
| WO | 2006075337 | 7/2006 |
| WO | 2008124765 | 10/2008 |

(Continued)

OTHER PUBLICATIONS

Durham, et al., Comparison of NEMA and Ultra-High Slip Motors on Cyclic Loads, 36th Annual Petroleum and Chemical Industry, Record of Conference Papers, IEEE Industrial Applications Society (Sep. 1989) pp. 91-95.

(Continued)

*Primary Examiner* — Kawing Chan
*Assistant Examiner* — Jorge L Carrasquillo
(74) *Attorney, Agent, or Firm* — Schultz & Associates, P.C.

(57) ABSTRACT

A system and methods are provided for controlling a motor of a rod pumping system using previous RPMs of the motor and predicting an RPM of the motor; correcting a power factor of a motor of a rod pumping system; allocating energy consumption and allocating energy generation for a set of wells connected to an electricity meter using an amount of energy generated by each well; and generating an alert if a set of data is beyond a threshold for the set of data.

6 Claims, 14 Drawing Sheets

(56) References Cited

U.S. PATENT DOCUMENTS

| | | | |
|---|---|---|---|
| 4,490,094 | A | 12/1984 | Gibbs |
| 4,767,280 | A | 8/1988 | Markuson et al. |
| 5,204,595 | A | 4/1993 | Opal et al. |
| 5,252,031 | A | 10/1993 | Gibbs |
| 5,284,422 | A | 2/1994 | Turner et al. |
| 5,318,409 | A | 6/1994 | London et al. |
| 5,372,482 | A | 12/1994 | London et al. |
| 5,425,623 | A | 6/1995 | London et al. |
| 5,661,386 | A | 8/1997 | Kueck et al. |
| 6,041,856 | A | 3/2000 | Thrasher et al. |
| 6,343,656 | B1 | 2/2002 | Vazquez et al. |
| 6,857,474 | B2 | 2/2005 | Bramlett et al. |
| 6,918,307 | B2 | 7/2005 | Ohlsson et al. |
| 7,143,016 | B1 | 11/2006 | Discenzo et al. |
| 7,168,924 | B2 | 1/2007 | Beck et al. |
| 2003/0014183 | A1 | 1/2003 | Feluch |
| 2008/0114811 | A1* | 5/2008 | Murdoch .................... 707/104.1 |
| 2009/0055029 | A1 | 2/2009 | Roberson et al. |
| 2012/0046796 | A1* | 2/2012 | Zhang ........................... 700/291 |
| 2012/0209442 | A1* | 8/2012 | Ree ................................ 700/295 |
| 2012/0265357 | A1* | 10/2012 | Song et al. ..................... 700/291 |
| 2013/0066571 | A1* | 3/2013 | Chamarti et al. ............... 702/62 |

FOREIGN PATENT DOCUMENTS

| | | |
|---|---|---|
| WO | 2009023106 | 2/2009 |
| WO | 2009029161 | 3/2009 |
| WO | 2009029162 | 3/2009 |
| WO | 2009035696 | 3/2009 |
| WO | 2010016821 | 2/2010 |
| WO | 2012030403 | 3/2012 |

OTHER PUBLICATIONS

Durham, et al., Effect of Cyclic Loading on Motor Efficiency, IEEE Transactions on Industry Applications (Nov./ Dec. 1988) pp. 1153-1159, vol. 24, No. 6.

Durham, et al., Pumping Unit Effect on Motor Efficiency, Southwestern Petroleum Short Course—89, pp. 308-320.

Durham, et al., Motor Design Slip Performance on Cyclic Loads, IEEE Transactions on Industry Applications (Sep./Oct. 1990) pp. 919-925, vol. 26, No. 5.

Gibbs, Utility of Motor Speed Measurements in Pumping Well Analysis and Control, SPE Production Engineering, (Aug. 1987) pp. 199-208.

Gibbs, et al., Inferring Power Consumption and Electrical Performance From Motor Speed in Oil-Well Pumping Units, IEEE Transactions on Industry Applications (Jan./Feb. 1997) pp. 187-193, vol. 30, No. 1.

Lea, et al., Study of the Cyclical Performance of Beam Pump Motors, SPE 18827, SPE Production Operations Symposium (Mar. 13-14, 1989) pp. 1-8.

McCoy, et al., Total Well Management: A Methodology for Maximizing Oil Production and Minimizing Operating Costs, SPE Third Annual Symposium—"The Challenge of Optimizing Operating Costs" (May 23, 1995) Calgary, Alberta, Canada.

McCoy, et al., Simplified Computer-Aided Analysis of Electrical Current in Motors Used for Beam Pumping Systems, SPE 25447, Production Operations Symposium (Mar. 21-23, 1993) pp. 375-388, Oklahoma City, OK, U.S.A.

McCoy, et al., Motor Power/Current Measurement for Improving Rod Pump Efficiencies, SPE 37499, 1997 SPE Production Operations Symposium (Mar. 9-11, 1997) pp. 814-826, Oklahoma City, OK.

Nolen, et al., Quantitative Determination of Rod-Pump Leakage With Dynamometer Techniques, SPE Production Engineering (Aug. 1990) pp. 225-230.

Skinner, Efficient Use of Electric Power in Production Operations, Journal of Petroleum Engineering (1984) pp. 1326-1334.

Neely, et al., Power Savings and Load Reductions on Sucker Rod Pumping Wells, Southwestern Petroleum Short Course—90 (1989) pp. 359-369.

Underwood, et al., Implementation of a Three-Phase Electronic Watt-Hour Meter Using the MSP430F471xx, Texas Instruments Application Report SLAA409A (Jun. 2009) pp. 1-31.

Fitzgerald, et al., Electric Machinery, 3rd Ed., McGraw-Hill (1971) p. 211. New York.

Master, G.M., Renewable and Efficient Electric Power Systems, Wiley-Interscience (1962) p. 64. Hoboken, New Jersey.

Webster, J.G. (Ed.), Electrical Management Signal Processing, and Displays, CRC Press LLC (2003) pp. 4-1-4-18. Boca Raton, Florida.

McCoy, et al., Application of Real-Time Measurement of Motor Power to Determination of Beam Pump Efficiency, Southern Petroleum Shortcourse (Apr. 1995) pp. 106-122. Texas Tech University, Lubbock, Texas.

File:Pump Jack Labelled.PNG, Wikipedia, http://en.wikipedia.org/wiki/File:Pump_Jack_labelled.png, Available Aug. 3, 2008, p. 1.

Skinner, Efficient Use of Electric Power in Production Operations, Journal of Petroleum Technology (1984) pp. 1326-1334.

Neely, et al., Power Savings and Load Reductions on Sucker Rod Pumping Wells, SPE 19715, 64th Annual Technical Conference and Exhibition of Society of Petroleum Engineers (Oct. 8-11, 1989) pp. 141-147, San Antonio, TX.

Howell, J.K. et al., Electrified Oil Production, Westinghouse Electric Corp. and The Petroluem Publishing Co., Tulsa, OK (1962) pp. 101-142.

* cited by examiner

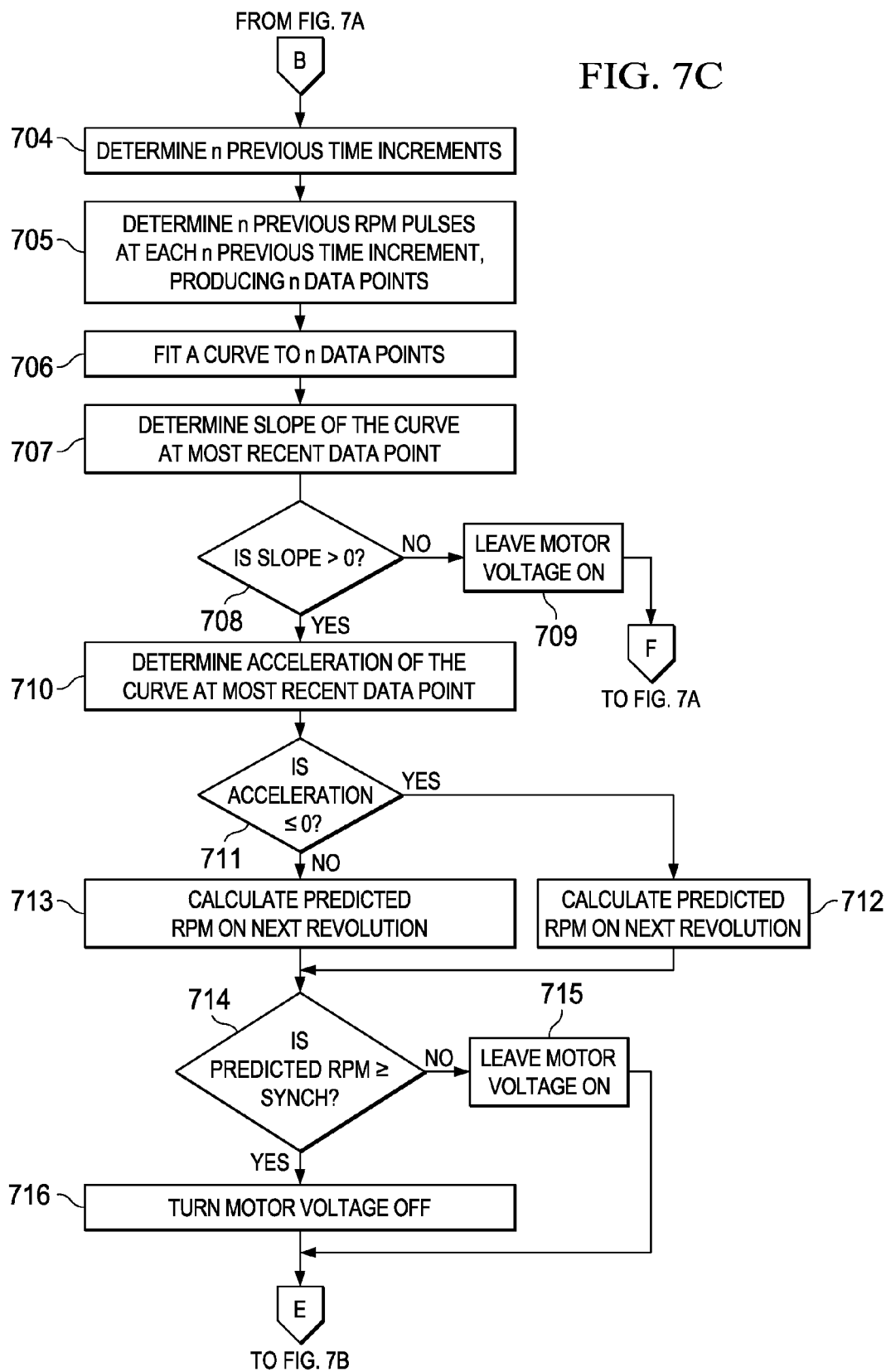

SYSTEM, METHOD AND APPARATUS FOR COMPUTING, MONITORING, MEASURING, OPTIMIZING AND ALLOCATING POWER AND ENERGY FOR A ROD PUMPING SYSTEM

CROSS REFERENCE TO RELATED APPLICATION

This application claims priority to U.S. Provisional Application No. 61/529,432 filed on Aug. 31, 2011.

FIELD OF THE INVENTION

The field of the invention relates to the control of rod pumping systems for oil and gas wells. In particular, the field of the invention relates to a system and method for computing, monitoring, measuring, optimizing, controlling and allocating power and energy for a rod pumping system.

BACKGROUND OF THE INVENTION

As energy costs rise, energy companies are increasingly concerned with optimizing their pumping unit systems, including reducing the amount of energy that a rod pumping system requires to operate and properly allocating costs between various wells. Referring to FIG. 1, in the prior art, rod pumping system 51 includes walking beam 52 pivotally supported by Samson post support assembly 68. Motor 53 connects to belt 61. Belt 61 connects to gearbox 54. Crank arm 60 connects to gearbox 54 and to pitman arm 69. Pitman arm 69 connects to walking beam 52. Walking beam 52 connects to horse head 55. Bridle 56 attaches to horse head 55 and to polished rod 57. Polished rod 57 connects to rod string 58 inside stuffing box 62. Rod string 58 connects to downhole pump 59. Electricity supply 63 connects to electricity meter 65 through transmission line 64. Electricity meter 65 connects to motor 53 through supply line 66.

A goal of the prior art has been to maximize the efficiency of rod pumping systems by reducing the amount of energy required to operate it. Such effects have included minimizing the real power required and energy losses from the power input of transmission line 64 to motor 53 to the useful power at downhole pump 59. A concurrent goal is to minimize the energy cost per barrel of oil produced in units of kilowatt hours per barrel (kWh/BBL). In furtherance of these goals the prior art has attempted to maximize the efficiency of motor 53, without complete success.

Alternating current (AC) power flow has the three components: active power, also known as true power (P), measured in watts (W); apparent power (S), measured in volt-amperes (VA); and reactive power (Q), measured in volt-amperes reactive (VAR).

The power factor is defined as:

$$F = \frac{P}{S}. \quad [1]$$

In the case of a perfectly sinusoidal waveform, P, Q, and S can be expressed as vectors that form a vector triangle such that:

$$S^2 = P^2 + Q^2. \quad [2]$$

If ϕ is the phase angle between current and voltage, then the power factor is equal to the cosine of the angle, cos ϕ, and:

$$P = S \cos \phi. \quad [3]$$

Since the units are consistent, the power factor is a dimensionless number between 0 and 1 for energy consumed and between −1 and 0 for energy generated. When the power factor is equal to 0, the energy flow is entirely reactive, and stored energy in the load returns to the source on each cycle. When the power factor is 1, all the energy supplied by the source is consumed by the load as real energy. Power factors are usually stated as "leading" or "lagging" to show the sign of the phase angle.

If a purely resistive load is connected to a power supply, current and voltage will change polarity in step, the power factor will be 1, and the electrical energy flows in a single direction across the network in each cycle. Inductive loads such as transformers and motors consume reactive power with current waveform lagging the voltage. Capacitive loads such as capacitor banks or buried cable generate reactive power with current phase leading the voltage. Both types of loads will absorb energy during part of the AC cycle, which is stored in the device's magnetic or electric field, only to return this energy back to the source during the rest of the cycle.

Electrical loads consuming alternating current power that are not purely resistive consume both real power and reactive power. The vector sum of real and reactive power is the apparent power. The presence of reactive power causes the real power to be less than the apparent power, and so, the electric load has a power factor of less than 1.

In the prior art, motor 53 is typically a three-phase AC induction motor running on 480 volts AC, 60 Hertz power. Motor 53 performs most efficiently and effectively during a heavily loaded, steady state operation. However, such an ideal operation of motor 53 is usually never attained because of the elasticity of rod string 58 and the geometry of rod pumping system 51. Due to the cyclic loading of rod pumping system 51, the instantaneous power requirements on motor 53 can be much higher or much lower than the average power required over one stroke of rod pumping system 51. When powering a perfectly mechanically balanced system—when the peak torque on gearbox 54 during the upstroke is equal to the peak torque on gearbox 54 during the downstroke—it is not uncommon for motor 53 to have periods during the stroke where the motor can experience states of overload, moderate load, no load, and negative load. Negative load means that rod pumping system 51 is driving motor 53 past its synchronous speed for a period of time. During such time, motor 53 acts as an asynchronous generator, putting power back into supply line 66.

Most oil and gas production companies experience negative loads, and consequently low power factors, caused by induction motors powering rod pumping systems. Electricity providers can penalize these companies for high demand and/or low power factors. It has been estimated that a lagging power factor, mostly caused by the induction motor, is responsible for as much as one-fifth of all grid losses in the United States, equivalent to 1.5% of total national power generation and costs on the order of $2 billion per year. Further, heating from high current flow causes transformers on both sides of electricity meters to fail. As a result, demand charges and power factor penalties are becoming more common for electric utility companies.

In the prior art, electricity meter 65 monitors the demand, energy usage, and power factor of rod pumping system 51 for well 67. The method typically used in the prior art to estimate power and energy consumption of rod pumping system 51 includes generating a random surface dynagraph card, typically by plotting load measurements of polished rod 57 versus position measurements of polished rod 57, calculating the average horsepower generated at polished rod 57, multiplying the horsepower by a loading factor and dividing the result by an estimated surface drive train efficiency, to obtain the input power of motor 53. However, the surface efficiency and the loading factor can change from stroke to stroke. Further, rod pumping system 51 does not produce identical surface dynagraph cards throughout the day. As a result, the method of the prior art is unreliable and inaccurate to measure and calculate the power and energy consumption, and power factor of for rod pumping system 51 for well 67. Further, this method of the prior art does measure or calculate the power and energy generated by the motor.

For multiple wells, rod pumping system 51 pumps at each well, all of which are connected to electricity meter 65. In this case, the power used to operate each rod pumping system 51, and how efficiently and effectively each rod pumping system 51 is using such power is of great importance. Further, if different wells have different owners or investors, then the allocation of energy consumption to each rod pumping system 51 is critical. Under prior art methods, energy consumption allocation is typically accomplished by totaling the energy consumed by each rod pumping system 51 connected to electricity meter 65 and dividing the total by the number of wells. This method is inaccurate because each rod pumping system 51 at each well differs in efficiency, power and energy consumed, power and energy generated, and power factor.

The prior art has attempted to address these problems, with limited success. For example, U.S. Pat. No. 5,204,595 to Opal et al. discloses controlling an electric drive motor coupled to reciprocating system by inserting a pair of power-off pulses in a reciprocation period of the motor energization cycle with one pulse in a top-of-cycle region and the other pulse in a bottom-of-cycle region to reduce rod stress and motor electrical power consumption and increase pump displacement and efficiency. However, the methods in Opal do not control the motor voltage by calculating a predicted RPM of the motor. Further, the methods do not correct a power factor of the motor or allocate energy consumption or energy generation among a plurality of rod pumping systems or determine electrical motor loading by calculating the RMS current on all three phases on a per stroke basis of the pumping unit and comparing the RMS current on all three phases to the full load current rating of the motor.

U.S. Pat. No. 5,284,422 to Turner et al. discloses monitoring and controlling a well pump apparatus with an electric motor. Electric current from the motor is measured periodically between the peak upstroke motor current and the peak downstroke motor current. Failure conditions are determined including sucker rod failure, counterweight loss or movement, and loss of a drive belt. The amount of work done by the pump well apparatus is determined. However, the determination of failure conditions in Turner is not useful in managing the energy consumption of the motor or the energy generation of the motor by controlling the motor voltage.

U.S. Pat. No. 5,661,386 Kueck et al. discloses a method and apparatus for assessing the efficiency of an in-service motor. The operating characteristics of the in-service motor are remotely measured and applied to an equivalent circuit to determine the performance characteristics of the in-service motor. The root mean square values of the voltage, current and their power factor are used to calculate rotor speed, power output, motor efficiency and torque of the electric induction motor. However, the Kueck method requires the use of an equivalent circuit that requires manual confirmation to evaluate the performance of the motor and thereby leads to a time consuming and costly method. Further, the method and apparatus in Kueck only detects and calculates deficient motor operating characteristics and provides no means for correcting such deficient motor operating characteristics.

U.S. Pat. No. 6,857,474 to Bramlett et al. discloses monitoring a reciprocating pump producing hydrocarbons from a well bore extending from the surface into the subterranean. The method includes generating a surface card and a downhole card. The method compares the generated surface card and the generated downhole card to "ideal" surface cards and downhole cards stored in a database to evaluate the energy consumption of the motor. However, the generated surface cards and downhole cards are inconsistent over time and thereby are prone to providing unreliable and inaccurate energy consumption data.

The prior art fails to disclose or suggest an apparatus and methods for accurately controlling a motor of a rod pumping system by measuring the current and voltage of the motor on a per stroke basis. Therefore, there is a need in the prior art for a system and methods for controlling a motor of a rod pumping system using previous RPMs of the motor and predicting an RPM of the motor; correcting a power factor of a motor of a rod pumping system; allocating energy consumption and allocating energy generation for a set of wells connected to an electricity meter using an amount of energy generated by each well; and generating an alert if a set of data of the motor is beyond a threshold for the set of data.

SUMMARY

In one embodiment, a method is provided for controlling a motor of a rod pumping system connected to a switch, the switch connected to a voltage supply, utilizing an energy monitoring device connected to the switch. The method comprises the steps of determining a last RPM pulse of the motor, measuring a new RPM pulse of the motor, calculating a time difference between the new RPM pulse and the last RPM pulse, calculating an instant RPM, measuring a present frequency of the voltage supply, calculating a motor synchronous speed, and determining a switch command for the switch based on the instant RPM and the motor synchronous speed.

In another embodiment, a method is provided for controlling a motor of a rod pumping system connected to a switch, the switch connected to a voltage supply, utilizing an energy monitoring device connected to the switch. The method comprises the steps of measuring a present frequency of the motor, calculating a motor synchronous speed, and determining a switch command for the switch from at least one previous time increment, at least one previous RPM pulse, and a predicted RPM.

In one embodiment, a method is provided for correcting a power factor of a motor in a system comprising a network server running a well management software, an energy monitoring device connected to the network server, the energy monitoring device in communication with the well management software, a power supply connected to the energy monitoring device, the motor having a plurality of phases connected to the power supply, and the motor powering a rod pumping system. The method comprises the steps of sending a data request between the well management software and the energy monitoring device, measuring a total power over a predetermined period of time, calculating a total reactive power over the predetermined period of time, determining a total present power factor, sending the total power, the total reactive power, and the total present power factor between the energy monitoring device and the well management software, setting the total present power factor, determining a desired power factor, and calculating an amount of capacitance to be added to each of the plurality of phases.

In one embodiment, a method is provided for allocating energy consumption for a set of wells in a system comprising a network server running a well management software, a set of energy monitoring devices connected to the network server, each energy monitoring device in communication with the well management software, the set of wells connected to the set of energy monitoring devices, an electricity meter connected to the set of wells and to the set of energy monitoring devices, an electricity utility company connected to the electricity meter and to the network server, and the well management software in communication with the electricity utility company. The method comprises the steps of sending a request for an electricity meter reading for a period of time between the well management software and the electricity utility company, determining the electricity meter reading for the set of wells for the period of time, sending the electricity meter reading between the electricity utility company and the well management software, sending a request for an amount of energy consumed per well and an amount of energy generated per well for the period of time between the well management software and the set of energy monitoring devices, measuring an amount of energy consumed by each of the set of wells for the period of time, measuring an amount of energy generated by each of the set of wells for the period of time, sending the amount of energy consumed by each of the set of wells for the period of time and the amount of energy generated by each of the set of wells for the period of time between the set of energy monitoring devices and the well management software, calculating a total energy consumption for the set of wells for the period of time, calculating a total energy generated for the set of wells for the period of time, calculating a net energy for each of the set of wells for the period of time, calculating a total net energy for the set of wells for the period of time, calculating an energy correction difference between the electricity meter reading and the calculated total net energy for the set of wells for the period of time, calculating a percentage of the total energy generated for each of the set of wells, and calculating a correct net energy consumption for each of the set of wells for the period of time.

In one embodiment, a method is provided for generating an alert in a system comprising a network server running a well management software, a data collector connected to the network server and in communication with the well management software, an energy monitoring device connected to the data collector, a motor connected to the energy monitoring device, and a rod pumping system powered by the motor. The method comprises the steps of measuring a set of data, sending the set of data between the energy monitoring device and the data collector, checking whether the set of data is beyond a threshold for the set of data, sending the set of data between the data collector and the well management software, generating an alert if the set of data is beyond the threshold for the set of data, and sending the alert between the data collector and the well management software.

In one embodiment, a system for controlling a motor having a plurality of phases and a switch connected to a rod pumping system and to an electricity meter comprises a network server having a first processor and a first memory, an energy monitoring device having a second processor and a second memory connected to the network server, to the motor, and to the electricity meter the second processor programmed to execute a motor control process, a data acquisition process, and an alert generation process.

In one embodiment, a system for allocating energy consumption and energy generation for a set of wells connected to an electricity meter connected to an electricity utility company having a first processor and a first memory, the electricity meter powering the set of wells, comprises a network server having a second processor, a second memory, and a well management software saved into the second memory and executed by the second processor, a set of energy monitoring devices, each energy monitoring device having a third processor and a third memory connected to the network server and in communication with the well management software. The set of energy monitoring devices connects to the set of wells. The network server connected to the electricity utility company. The well management software in communication with the electricity utility company. The first processor programmed to carry out the steps of determining the electricity meter reading for the set of wells for a period of time, sending the electricity meter reading between the electricity utility company and the well management software. The second processor programmed to carry out the steps of sending a request for the electricity meter reading for the period of time between the well management software and the electricity utility company, sending a request for an amount of energy consumed per well and an amount of energy generated per well for the period of time between the well management software and the set of energy monitoring devices, calculating a total energy consumption for the set of wells for the period of time, calculating a total energy generated for the set of wells for the period of time, calculating a net energy for each of the set of wells for the period of time, calculating a total net energy for the set of wells for the period of time, calculating an energy correction difference between the electricity meter reading and the calculated total net energy for the set of wells for the period of time, calculating a percentage of the total energy generated for each of the set of wells, calculating a correct net energy consumption for each of the set of wells for the period of time. The third processor programmed to carry out the steps of, measuring an amount of energy consumed by each of the set of wells for the period of time, measuring an amount of energy generated by each of the set of wells for the period of time, sending the amount of energy consumed by each of the set of wells for the period of time and the amount of energy generated by each of the set of wells for the period of time between the set of energy monitoring devices and the well management software.

In one embodiment, a system for generating an alert from a motor having a plurality of phases powering a rod pumping system comprises an energy monitoring device having a first processor and a first memory connected to the motor, a data collector having a second processor and a second memory connected to the energy monitoring device, a network server having a third processor, a third memory, and a well management software saved into the third memory and executed by the third processor, connected to the data collector. The well management software in communication with the data collector. The first processor programmed to carry out the steps of measuring a set of data, sending the set of data to the data collector. The second processor programmed to carry out the steps of checking whether the set of data is beyond a threshold for the set of data, sending the set of data to the well management software, generating an alert if the set of data is beyond the threshold for the set of data, sending the alert to the well management software. The third processor programmed to carry out the steps of notifying an operator of the alert.

BRIEF DESCRIPTION OF THE DRAWINGS

The disclosed embodiments will be described with reference to the accompanying drawings.

FIG. 7C is a partial flow chart of a preferred embodiment of a motor control process.

DETAILED DESCRIPTION

Figure 1:
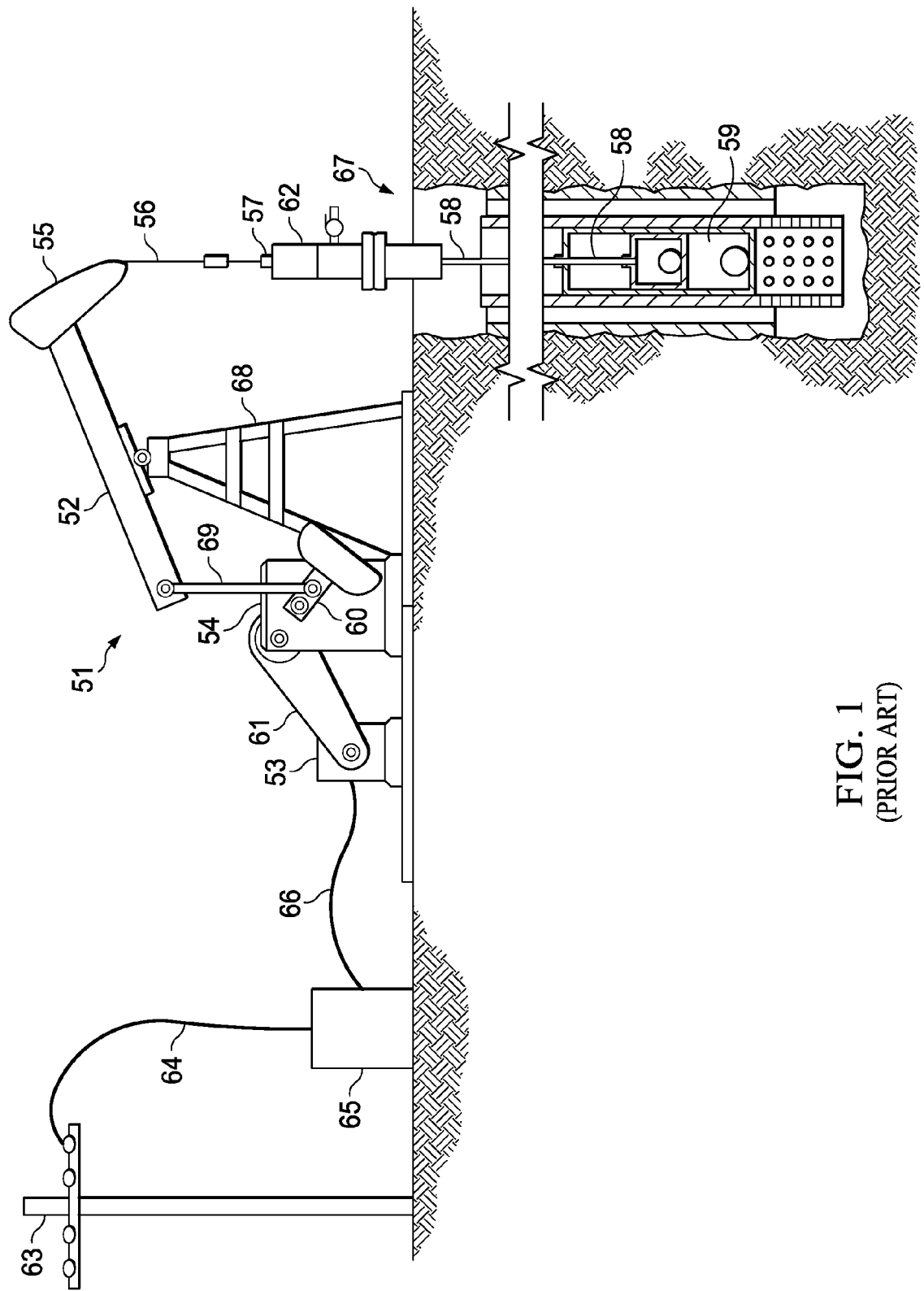
FIG. 1 is a schematic of a rod pumping system of the prior art.

It will be appreciated by those skilled in the art that aspects of the present disclosure may be illustrated and described herein in any of a number of patentable classes or context including any new and useful process, machine, manufacture, or composition of matter, or any new and useful improvement thereof. Therefore, aspects of the present disclosure may be implemented entirely in hardware, entirely in software (including firmware, resident software, micro-code, etc.) or combining software and hardware implementation that may all generally be referred to herein as a "circuit," "module," "component," or "system." Further, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. For example, a computer readable storage medium may be, but not limited to, an electronic, magnetic, optical, electromagnetic, or semiconductor system, apparatus, or device, or any suitable combination of the foregoing. More specific examples of the computer readable storage medium would include, but are not limited to: a portable computer diskette, a hard disk, a random access memory ("RAM"), a read-only memory ("ROM"), an erasable programmable read-only memory ("EPROM" or Flash memory), an appropriate optical fiber with a repeater, a portable compact disc read-only memory ("CD-ROM"), an optical storage device, a magnetic storage device, or any suitable combination of the foregoing. Thus, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. The propagated data signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, or any suitable combination thereof.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on an energy monitoring device, partly on the energy monitoring device, entirely on a data collector, partly on the data collector, as a stand-alone software package, partly on the energy monitoring device and partly on a network server, partly on the energy monitoring device, partly on the data collector, and partly on the network server, or entirely on the network server. In the network server scenario, the network server may be connected to the energy monitoring device and/or the data collector through any type of network, including a local area network ("LAN") or a wide area network ("WAN"), or the connection may be made to an external computer connected to the energy monitoring device or the data collector (for example, through the Internet using an Internet Service Provider) or in a cloud computing environment or offered as a service such as a Software as a Service ("SaaS").

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

Figure 2:
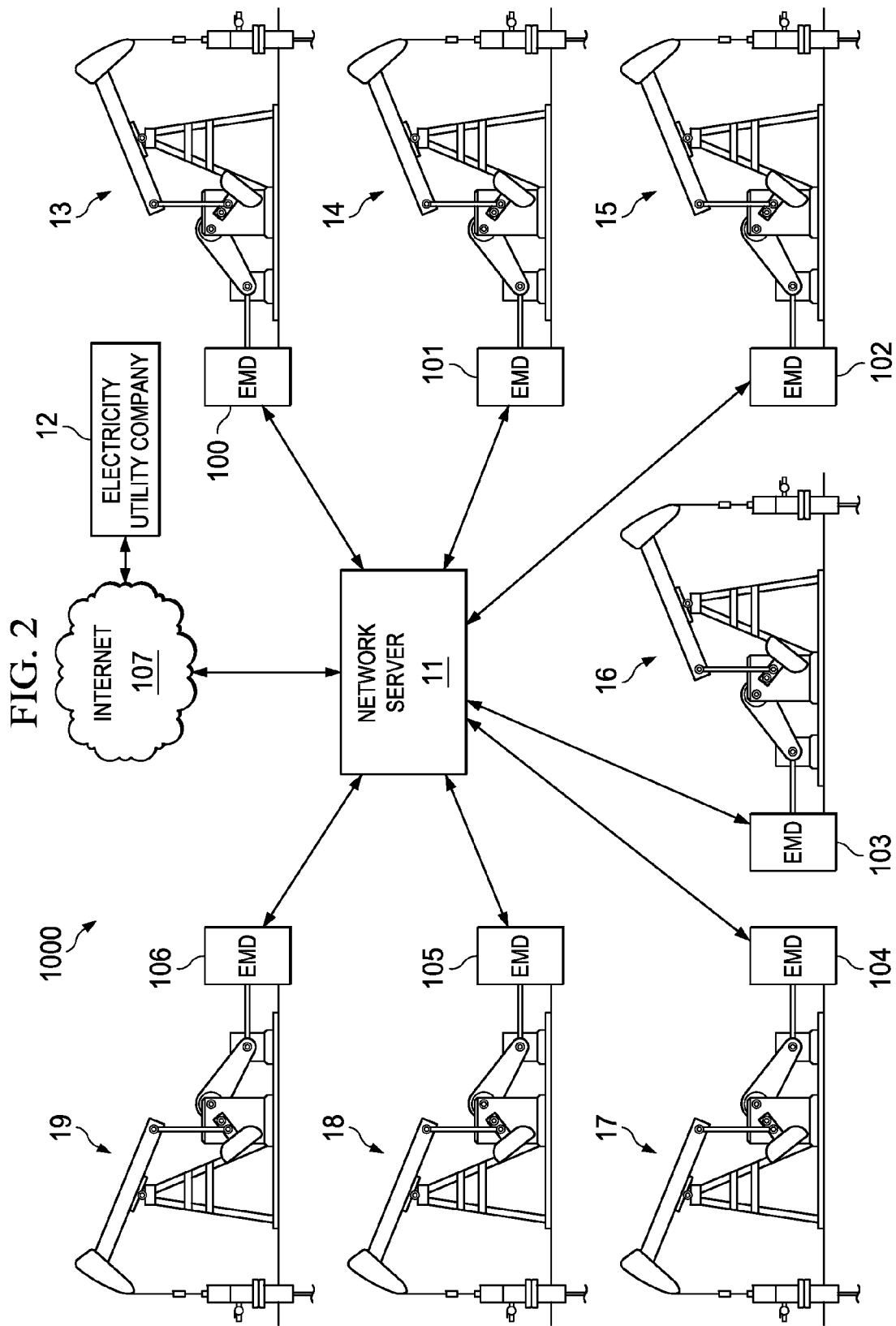
FIG. 2 is a schematic of an energy monitoring system of a preferred embodiment.

Referring to FIG. 2, system 1000 comprises network server 11 connected to energy monitoring devices 100, 101, 102, 103, 104, 105, and 106, and internet 107. Any number of energy monitoring devices can be supported. Energy monitoring device 100 connects to rod pumping system 13. Energy monitoring device 101 connects to rod pumping system 14. Energy monitoring device 102 connects to rod pumping system 15. Energy monitoring device 103 connects to rod pumping system 16. Energy monitoring device 104 connects to rod pumping system 17. Energy monitoring device 105 connects to rod pumping system 18. Energy monitoring device 106 connects to rod pumping system 19. Electricity utility company 12 connects to internet 107.

In one embodiment, network server 11 wirelessly connects to the energy monitoring devices through internet 107 via a virtual private network ("VPN"). In another embodiment, network server 11 connects with the energy monitoring devices through internet 107 with a broadband cable connection. In another embodiment, network server 11 connects with the energy monitoring devices through a telephone line. In another embodiment, network server 11 connects with the energy monitoring devices through a radio.

Figure 3:
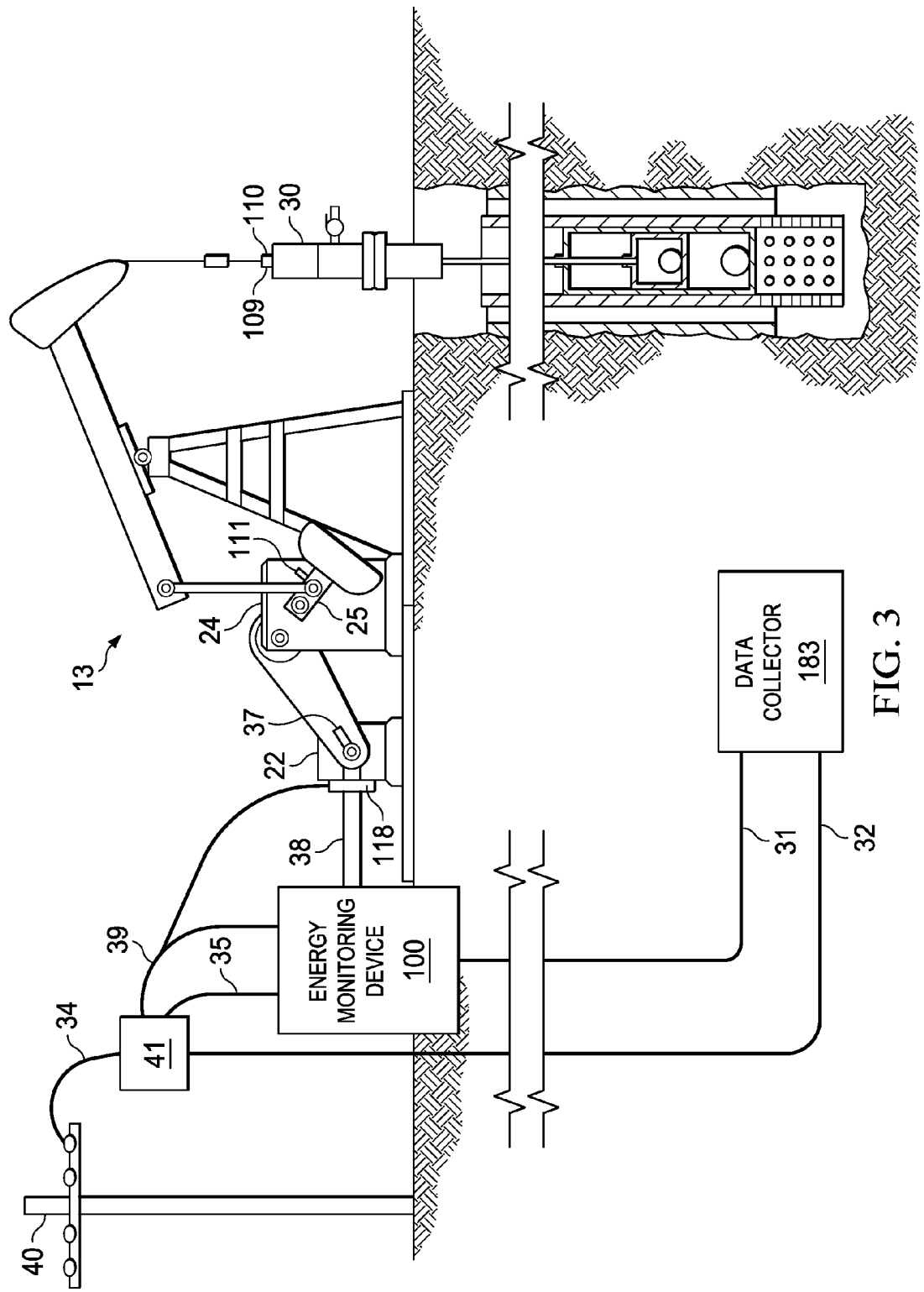
FIG. 3 is a schematic of a preferred embodiment of a rod pumping system.

Referring to FIG. 3, in one embodiment, rod pumping system 13 includes motor 22 and gearbox 24. Rod force sensor 109 attaches to polished rod 30. Rod position sensor 110 attaches to polished rod 30. Motor RPM sensor 37 attaches to motor 22. Crank position sensor 111 attaches to crank 25.

Power supply 40 connects to electricity meter 41 with power line 34. Electricity meter 41 connects to motor switch 118 with supply line 39. Motor switch 118 connects to motor 22. Electricity meter 41 connects to and powers energy monitoring device 100 with supply line 35. Energy monitoring device 100 connects to motor switch 118 through switch communication 38. Data collector 183 connects to energy monitoring device 100 with data connection 31. Electricity meter 41 connects to and powers data collector 183 with supply line 32.

In a preferred embodiment, motor 22 is a three-phase AC induction motor running on 480 Volts AC, 60 Hertz power.

In a preferred embodiment, motor switch 118 is a Series E3P three-phase output to 75A 600V AC, DC and AC control solid-state relay available from Teledyne Relays of Teledyne Technologies, Inc. of Thousand Oaks, Calif. Other suitable relays and switches known in the art may be employed. For example, an insulated-gate bipolar transistor ("IGBT") or a silicon-controlled rectifier ("SCR") may be used with equal success.

In a preferred embodiment, motor RPM sensor 37 is a motor Hall Effect transducer manufactured by Lufkin Automation, a division of Lufkin Industries, Inc. of Lufkin, Tex. that detects a magnet attached to the shaft of motor 22 and produces a pulse.

In another embodiment, motor RPM sensor 37 is an RPM transducer with infinite resolution that returns a voltage proportional to the RPM. In this embodiment, RPM of motor 22 is sampled at a fast rate enabling the motor voltage to be turned off or on at the instant the RPM of motor 22 exceeds a predetermined RPM.

In a preferred embodiment, rod force sensor 109 is a stainless steel polished rod load cell manufactured by Weatherford International, Ltd. of Houston, Tex. In another embodiment, rod force sensor 109 is a load cell manufactured by Lufkin Automation, a division of Lufkin Industries, Inc. of Lufkin, Tex. Other suitable load sensors known in the art may be employed.

In a preferred embodiment, rod position sensor 110 is a dual-axis, accelerometer-based dual position sensor manufactured by Weatherford International, Ltd. of Houston, Tex. Other suitable position sensors known in the art may be employed.

In a preferred embodiment, crank position sensor 111 is a Hall Effect crank transducer that detects a magnet attached to crank 25 manufactured by Lufkin Automation, a division of Lufkin Industries, Inc. of Lufkin, Tex. Other Hall Effect transducers known in the art may be employed. Other suitable position sensors known in the art may be employed with equal success.

Figure 4:
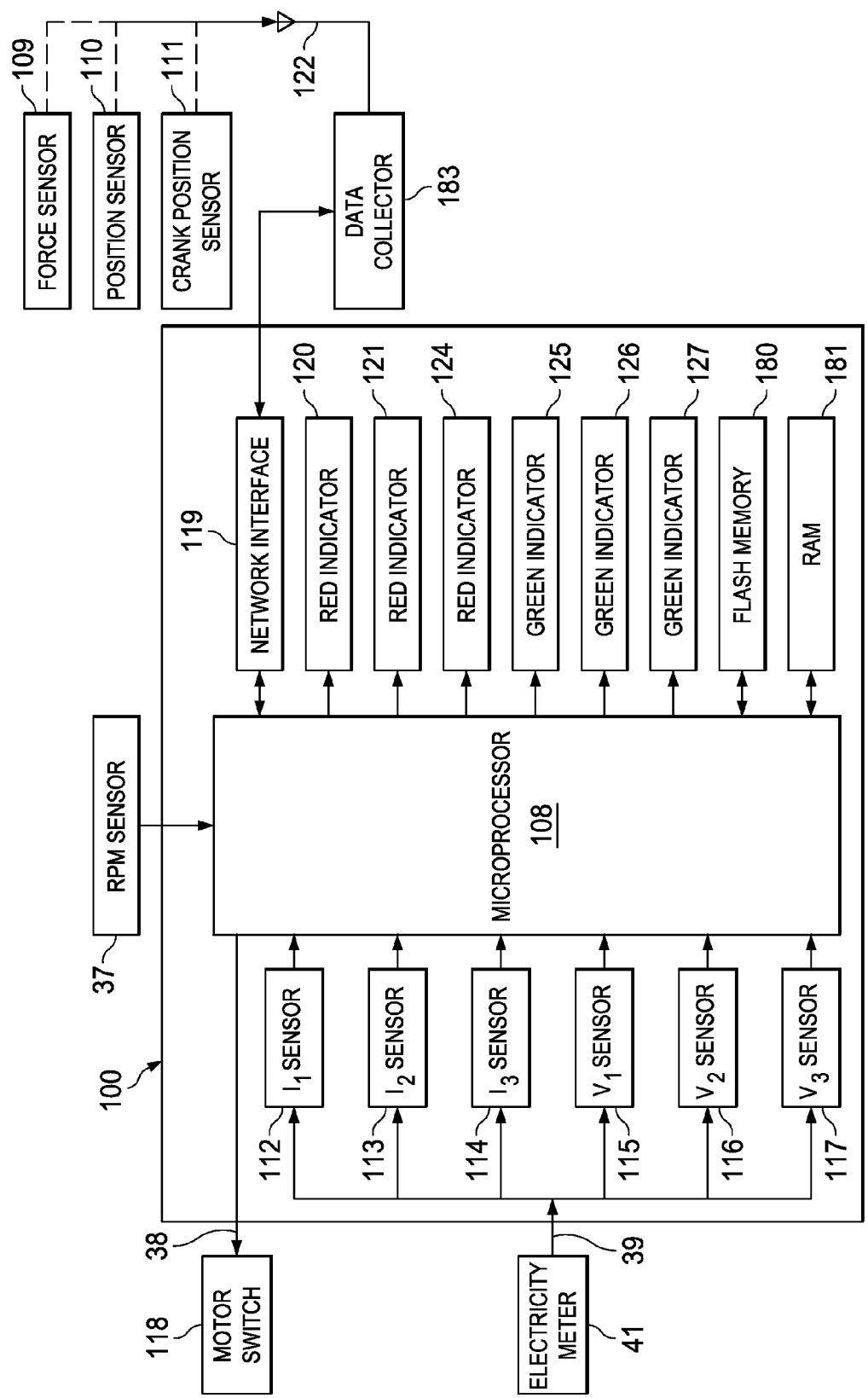
FIG. 4 is a block diagram of a preferred embodiment of an energy monitoring device.

Referring to FIG. 4, motor RPM sensor 37 connects to microprocessor 108, providing RPM data of motor 22 to microprocessor 108. Microprocessor 108 connects to motor switch 118 through switch communication 38, providing on/off output commands. Flash memory 180 and random-access memory ("RAM") 181. connect to microprocessor 108. Rod force sensor 109 and rod position sensor 110 connect to data collector 183. Rod force sensor 109 and rod position sensor 110 provide force and position data of polished rod 30, respectively, to data collector 183. Crank position sensor 111 connects to data collector 183, providing position data of crank 25. Data collector 183 connects to network interface 119. Network interface 119 connects to microprocessor 108. Microprocessor 108 provides output data to network interface 119. Network interface 119 converts the output data to an output digital signal and provides the output digital signal to data collector 183 for communication with network server 11 through antenna 122. Microprocessor 108 receives an input digital signal from network server 11 through antenna 122, data collector 183, and network interface 119. Energy monitoring device 100 includes current sensors 112, 113, and 114 and voltage sensors 115, 116, and 117. Current sensors 112, 113, and 114 measure current from the first, second, and third phases, respectively, of motor 22. Voltage sensors 115, 116, and 117 measure voltage from the first, second, and third phases, respectively, of motor 22. Microprocessor 108 connects to red indicators 120, 121, and 124. Microprocessor 108 connects to green indicators 125, 126, and 127.

Flash memory 180 is pre-programmed with the number of poles of motor 22 to which energy monitoring device 100 is connected. Flash memory 180 stores measurements made by energy monitoring device 100 including motor RPM and the full load amp rating of the motor 22. A motor control process, a data acquisition process, and an alert generator process live in flash memory 180 and are executed by microprocessor 108.

In an alternative embodiment, rod force sensor 109, rod positions sensor 110, and crank position sensor 111 each connect to microprocessor 108, and antenna 122 connects to network interface 119 to communicate with network server 11. In this embodiment, microprocessor 108 carries out the functions of data collector 183.

In a preferred embodiment, microprocessor 108 is a mixed signal micro controller, model number MSP430F471X71PZ, manufactured by Texas Instruments Inc. of Dallas, Tex. In this embodiment, the MSP430F471X71PZ micro controller comprises a 16 MHz CPU with MSP430CPUx architecture, 120 kb of flash memory, 4 kb of RAM, and a counter. The analog front-end consists of up to seven analog to digital converters (ADC) based on a second order sigma-delta architecture that supports differential inputs. The sigma-delta ADCs (SD16) have a resolution of 16 bits and are configured and grouped together for simultaneous sampling of voltages and currents on the same trigger. In this embodiment, the modulation frequency is $f_m$=1.048576 Mhz, resulting in a sampling frequency $f_s$ of:

$$f_s = \frac{f_m}{256} = 4096 \text{ samples per second.} \quad [4]$$

Other suitable microprocessors known in the art may be employed with equal success.

In a preferred embodiment, each of current sensors 112, 113, and 114 is a wire lead current transformer, model number CR8450 manufactured by CR Magnetics, Inc. of St. Louis, Mo. Other suitable current transformers known in the art may be employed.

In a preferred embodiment, voltage sensors 115, 116, and 117 comprise supply line 39 from electricity meter 41 connected to spike protection varistors, a voltage divider, and a RC low-pass filter that acts as an anti-alias filter to step-down the voltage of supply line 39 for direct input into three ADCs at microprocessor 108, thereby measuring the voltage of the first, second, and third phases, respectively, of motor 22.

In a preferred embodiment, network interface 119 is a 10/100/1000 Gigabit Ethernet network adapter. Other suitable network adapters will suffice. In the alternative embodiment, network interface 119 is a cellular network adapter operating in the GSM band. In another embodiment, network interface 119 is a cellular network adapter operating in the PCS band. Other cellular network adapters known in the art may be employed.

In a preferred embodiment, rod force sensor 109, rod position sensor 110, and crank position sensor 111 connect wirelessly to data collector 183 through antenna 122 via a radio frequency.

In another embodiment, rod force sensor 109, rod position sensor 110, and crank position sensor 111 connect to data collector 183 through a wired connection cable connected to each of rod force sensor 109, rod position sensor 110, and crank position sensor 111, and to data collector 183.

In a preferred embodiment, data collector 183 is a Lufkin SAM Well Manager manufactured by Lufkin Automation, a division of Lufkin Industries, Inc. of Lufkin, Tex. In another embodiment, data collector 183 is a Weatherford Well Pilot manufactured by Weatherford International, Ltd. of Houston, Tex. Other suitable data collectors known in the art may be employed with equal success.

In a preferred embodiment, a first set of program instructions are installed in flash memory 180 of energy monitoring device 100 prior to deployment. Upon powering energy monitoring device 100 in the field, the first set of program instructions are executed by microprocessor 108 and operate continuously to execute program instructions to be further discussed. In an alternate embodiment, the first set of program instructions are stored on a computer readable media and installed in the field during deployment.

Figure 5A:
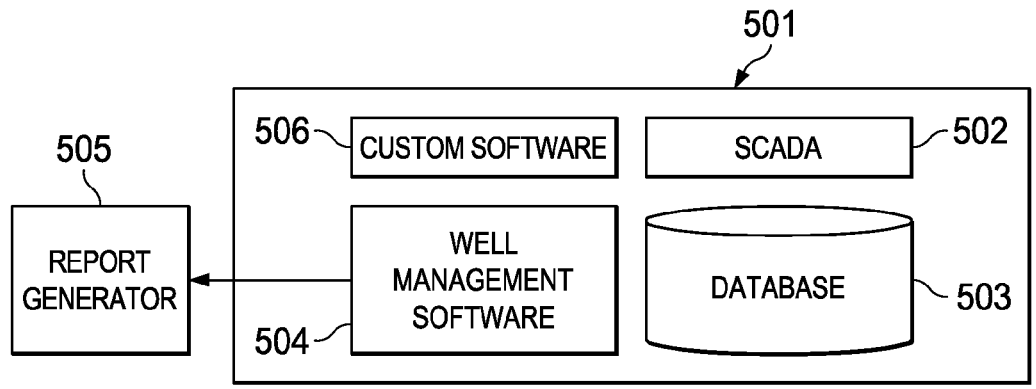
FIG. 5A is a block diagram of a preferred embodiment of a network server.

Referring to FIG. 5A, in one embodiment, network server 501 comprises supervisory control and data acquisition program ("SCADA") 502, database 503, well management software 504, and custom software 506. Network server 501 corresponds with network server 11 of FIG. 2. In a preferred embodiment, well management software 504 is the XSPOC well management software program sold by Theta Oilfield Services, Inc. of Bakersfield, Calif. that provides open database integration with database 503, and report generator 505.

A second set of program instructions, included in custom software 506, are carried out by network server 501 on database 503 to operate on data sent to network server 11 by energy monitoring device 100 or data collector 183 as further described below.

Figure 5B:
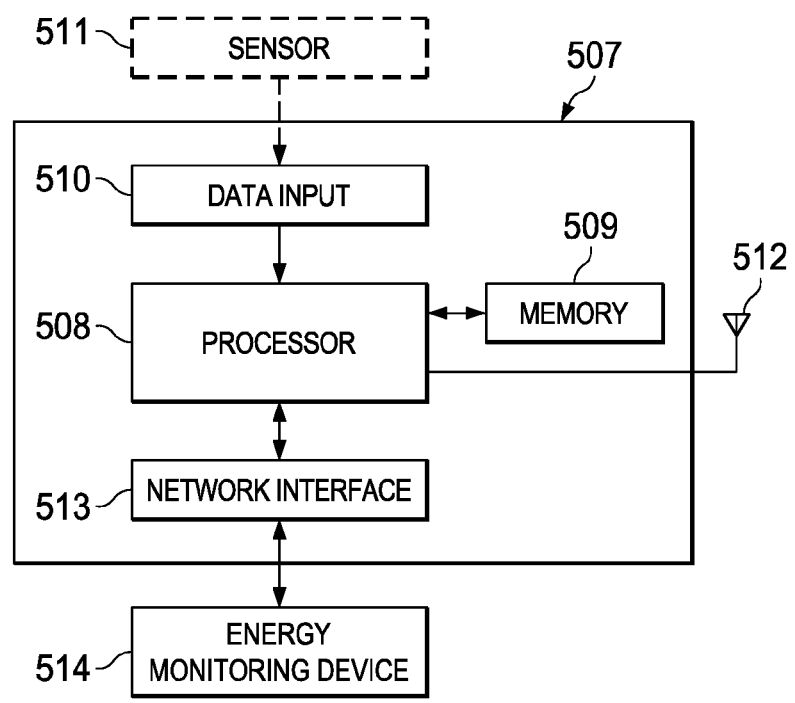
FIG. 5B is a block diagram of a preferred embodiment of a data collector.

Referring to FIG. 5B, data collector 507 includes processor 508 connected to memory 509, data input 510, network interface 513, and antenna 512. Data collector 507 corresponds with data collector 183 of FIGS. 3 and 4. In one embodiment, data input 510 connects to sensor 511. In another embodiment, sensor 511 connects wirelessly to antenna 512. Network interface 513 connects to energy monitoring device 514.

Data collector 507 is configured with a third set of program instructions which are executed when data collector 507 is powered in the field. The third set of program instructions are a set of machine code instructions that examine contents of a set of registers, set or clear flags based on a set of predetermined logical rules and the contents of the set of registers, receives data from energy monitoring device 100 and any other onsite devices and sensors, and transmits data to network server 11.

Embodiments of a motor control process, a data acquisition process, and an alert generation process executed by a combination of network server 11, energy monitoring device 100, and data collector 183 will be described below.

Figure 6:
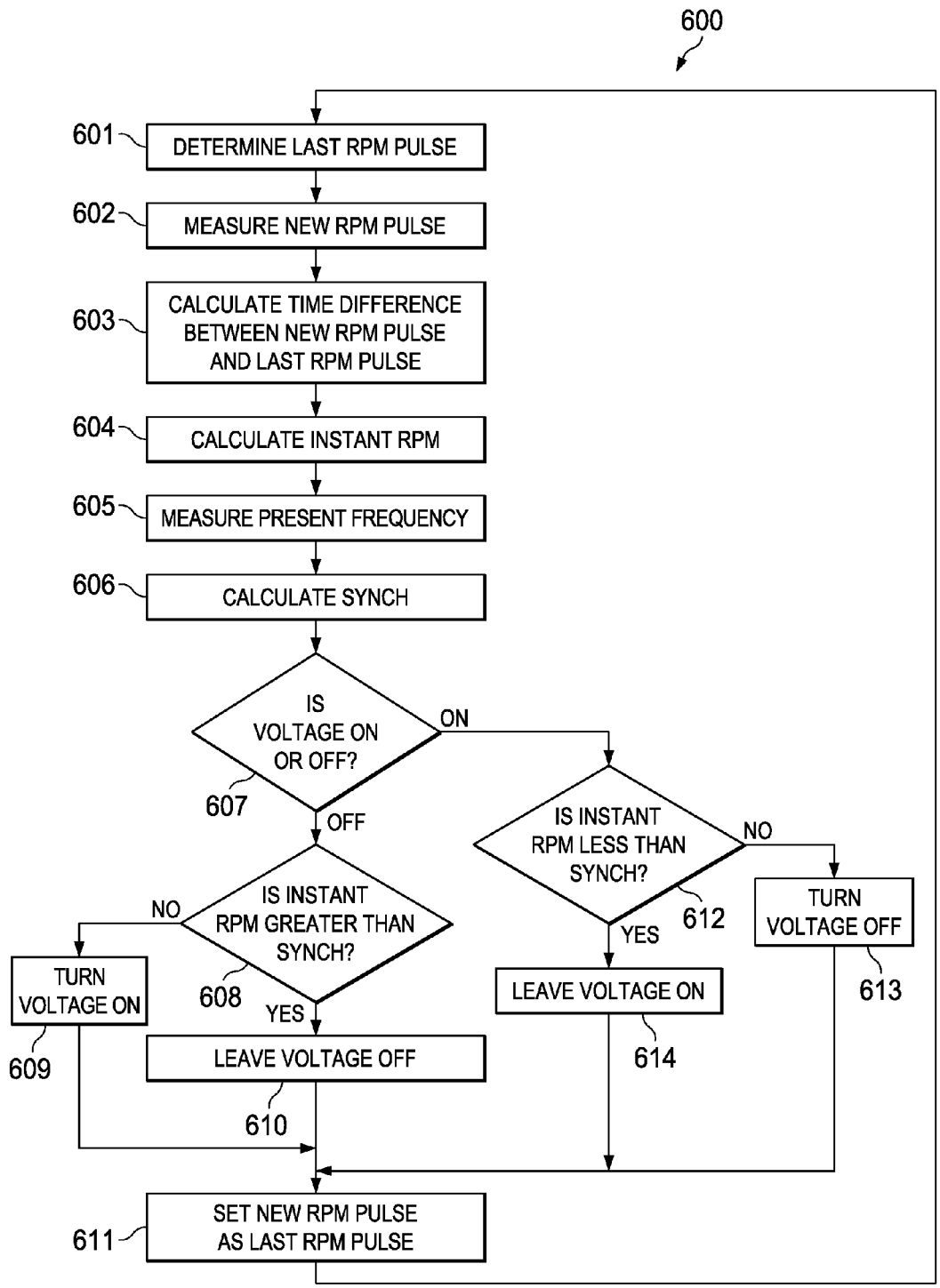
FIG. 6 is a flow chart of a preferred embodiment of a motor control process.

Referring to FIG. 6, motor control process 600 is described. In a preferred embodiment, microprocessor 108 of energy monitoring device 100 executes motor control process 600. In step 601, a last RPM pulse of the motor is determined. The last RPM pulse is the RPM of the motor at the last time interval. In step 602, a new RPM pulse of the motor is measured. The new RPM pulse is the next RPM of the motor to be detected at the next time interval. A time difference between the new RPM pulse and the last RPM pulse, defined by $RPM_{new} - RPM_{last}$ is calculated in step 603. In step 604, an instant RPM is calculated by:

$$RPM_{instant} = \frac{60}{RPM_{new} - RPM_{last}}. \quad [5]$$

A present frequency of the voltage supply to the motor is measured in step 605. In step 606, a synchronous speed of the motor is calculated by:

$$Synch = \frac{120 \cdot f_{present}}{n_{poles}}, \quad [6]$$

where $f_{present}$ is the present frequency and $n_{poles}$ is the number of poles of the motor. A determination of whether the voltage supply to the motor is on or off is made in step 607.

If voltage supply to the motor is off, then a determination of whether the instant RPM of the motor is greater than the synchronous speed of the motor is made in step 608. If the instant RPM of the motor is not greater than the synchronous speed, i.e. the instant RPM is less than or equal to the synchronous speed, then a command to turn on the voltage supply to the motor is sent to the motor switch in step 609. If the instant RPM is greater than the synchronous speed, then a null command is sent to the motor switch in step 610 and the voltage supply to the motor remains off.

If the voltage supply to the motor is on, then a determination of whether of the instant RPM is less than the synchronous speed is made in step 612. If the instant RPM is not less than the synchronous speed, i.e., if the instant RPM is greater than or equal to the synchronous speed, then a command to turn the voltage supply to the motor off is sent to the motor switch in step 613. If the instant RPM is less than the synchronous speed, then a null command is sent to the motor switch in step 614 and the voltage supply to the motor remains on.

In step 611, the new RPM pulse is set as the last RPM pulse and motor control process 600 returns to step 601.

Figure 7A:
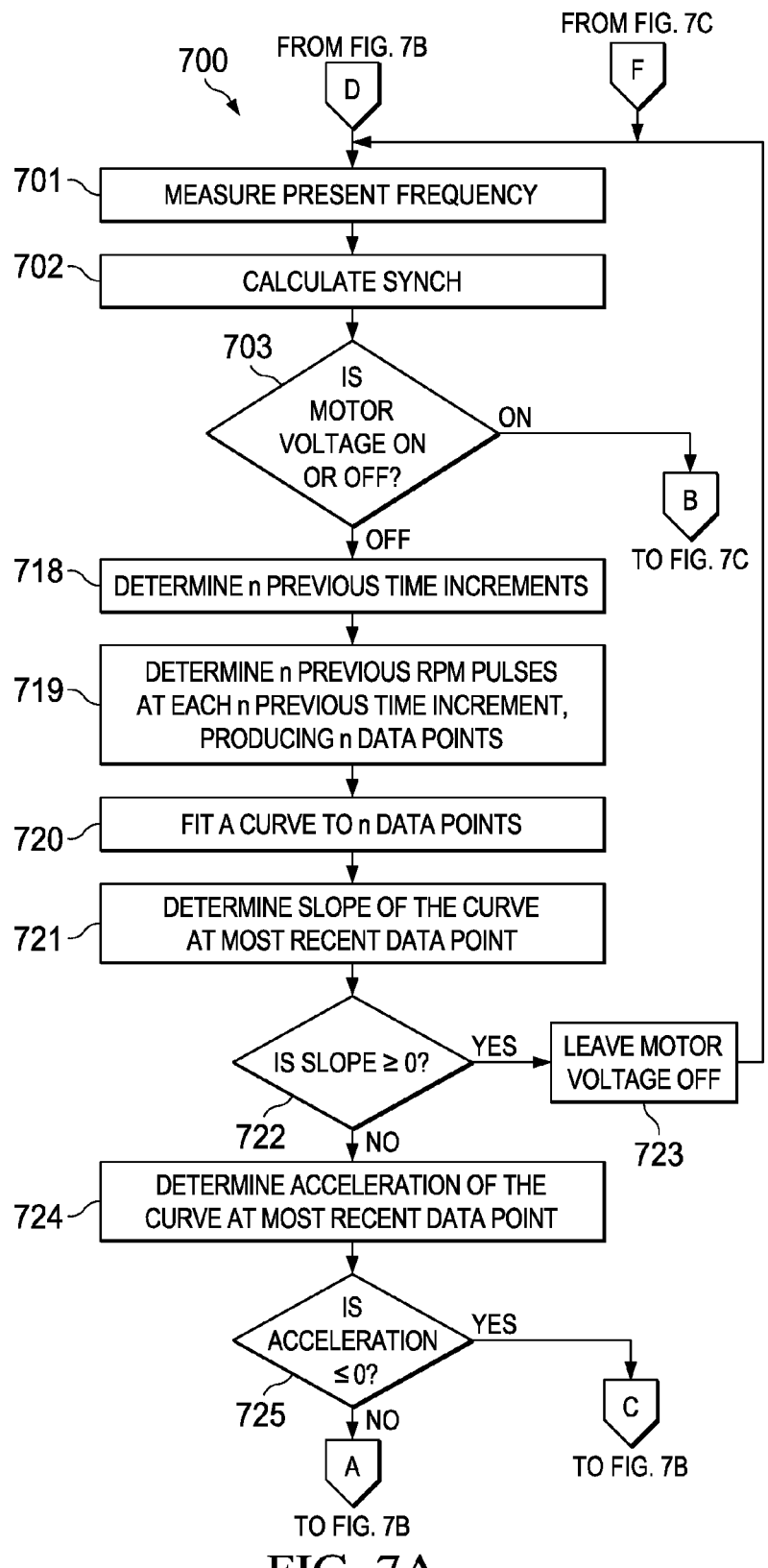
FIG. 7A is a partial flow chart of a preferred embodiment of a motor control process.
Figure 7B:
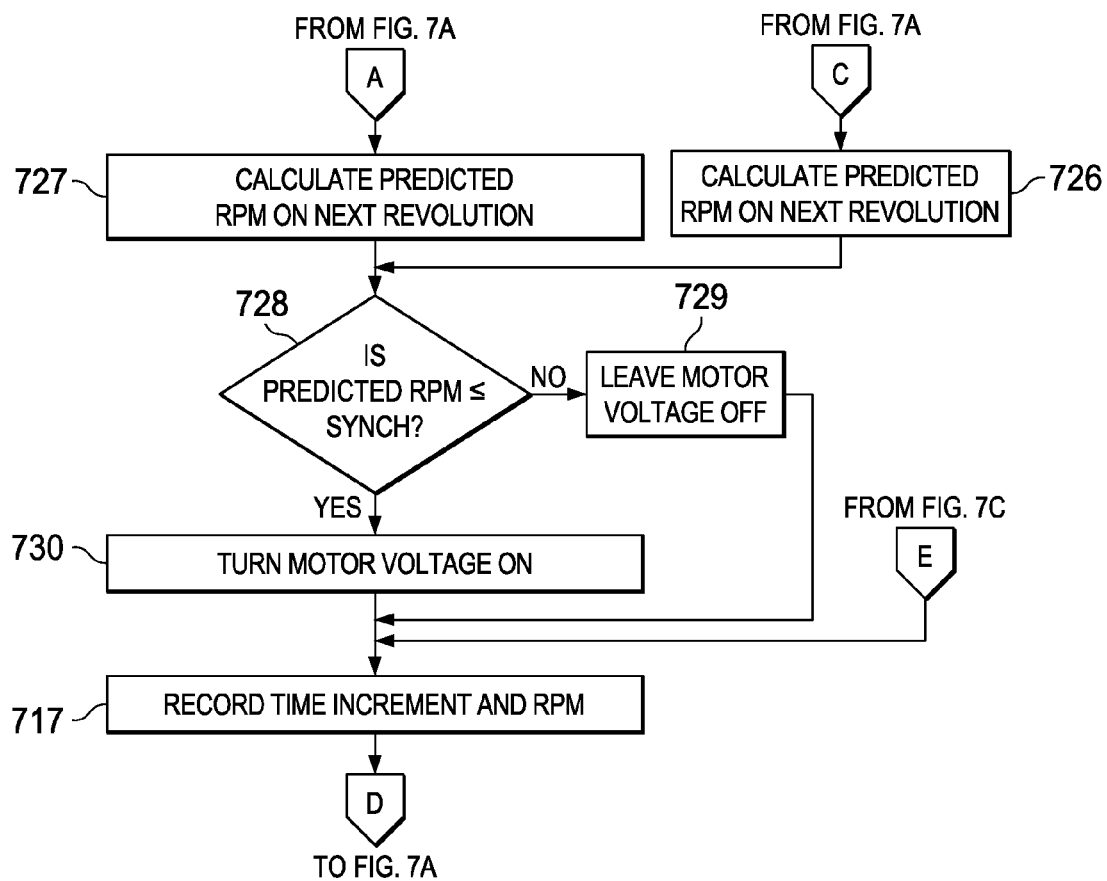
FIG. 7B is a partial flow chart of a preferred embodiment of a motor control process.

Referring to FIGS. 7A, 7B, and 7C, in another embodiment, motor control process 700 is described. In a preferred embodiment, microprocessor 108 of energy monitoring device 100 executes motor control process 700. In step 701, a present frequency of the voltage supply to the motor is measured. In step 702, a synchronous speed of the motor is calculated by:

$$Synch = \frac{120 \cdot f_{present}}{n_{poles}}, \quad [7]$$

where $f_{present}$ is the present frequency and $n_{poles}$ is the number of poles of the motor. In step 703, a determination of whether the voltage supply to the motor is on or off is made.

If the voltage supply to the motor is on, then a determination of n previous time increments is made in step 704 by defining each of the n previous time increments by:

$$\Delta x_i = x_i - x_{i-1}, \quad [8]$$

where i=1, 2, ..., n and $\Delta x_i$ is the time increment. In step 705, an n number of previous RPM pulses, $y_i$, at each of the n previous time increments $\Delta x_i$, is determined by:

$$y_i = \frac{60}{\Delta x_i}, \quad [9]$$

Steps 704 and 705 produce an n number of data points comprising ($x_i$, $y_i$). In a preferred embodiment, n=3.

In step 706, a curve is fit to the n number of data points. In a preferred embodiment, the curve is a polynomial defined by:

$$P(x) = \sum_{i=1}^{n} \left( \prod_{j=1, j \neq i}^{n} \frac{(x - x_j)}{(x_i - x_j)} \right) y_i. \quad [10]$$

In step 707, a slope of the curve P(x) at the most recent data point is determined by:

$$\left. \frac{dP}{dx} \right|_{x_n}. \quad [11]$$

In step 708, a determination of whether the slope of the curve P(x) is greater than zero is determined.

If the slope is not greater than zero, i.e., the slope is less than or equal to zero, then a null command is sent to the motor switch in step 709 and the voltage supply to the motor remains on. Motor control process 700 returns to step 701.

If the slope is greater than zero, then an acceleration of the curve P(x) at the most recent data point is determined in step 710 by:

$$\left. \frac{d^2 P}{dx^2} \right|_{x_n}. \quad [12]$$

In step 711, a determination of whether the acceleration of the curve is less than or equal to zero is made.

If the acceleration is less than or equal to zero, then a predicted RPM of the motor on a next revolution is calculated in step 712 by:

$$(x - x_n)P(x) - 60 = 0, \text{ and} \quad [13]$$

$$\tilde{y} := \frac{60}{\tilde{x} - x_n}, \quad [14]$$

where $\tilde{x}$ solves equation [13] and $\tilde{y}$ is the predicted RPM.

If the acceleration is not less than or equal to zero, i.e., the acceleration is greater than zero, then the predicted RPM of the motor on the next revolution is calculated in step 713 by:

$$(x - x_n)^2 \left. \frac{dP}{dx} \right|_{x_n} + (x - x_n)P(x_n) - 60 = 0, \text{ and} \quad [15]$$

$$\tilde{y} := \frac{60}{\tilde{x} - x_n}, \quad [16]$$

where $\tilde{x}$ solves equation [15] and $\tilde{y}$ is the predicted RPM.

In step 714, a determination of whether the predicted RPM is greater than or equal to the synchronous speed calculated in step 702 is made.

If the predicted RPM is not greater than or equal to the synchronous speed, i.e., the predicted RPM is less than the synchronous speed, then a null command is sent to the motor switch in step 715 and the voltage supply to the motor remains on.

If the predicted RPM is greater than or equal to the synchronous speed, then a command to turn the voltage supply to the motor off is sent to the motor switch in step 716.

If the voltage supply to the motor is off, then a determination of n previous time increments is made in step 718 by defining each of the n previous time increments by:

$$\Delta x_i = x_i - x_{i-1}, \quad [17]$$

where i=1, n and $\Delta x_i$ is the time increment. In step 719, an n number of previous RPM pulses, $y_i$, at each of the n previous time increments, $\Delta x_i$, is determined by:

$$y_i = \frac{60}{\Delta x_i}, \quad [18]$$

Steps 718 and 719 produce a n number of data points. In a preferred embodiment, n=3.

In step 720, a curve is fit to the n number of data points. In a preferred embodiment, the curve is a polynomial defined by:

$$P(x) = \sum_{i=1}^{n} \left( \prod_{j=1, j \neq i}^{n} \frac{(x - x_j)}{(x_i - x_j)} \right) y_i. \quad [19]$$

In step 721, a slope of the curve P(x) at the most recent data point is determined by:

$$\left. \frac{dP}{dx} \right|_{x_n}. \quad [20]$$

In step 722, a determination of whether the slope of the curve P(x) is greater than or equal to zero is determined.

If the slope is greater than or equal to zero, then a null command is sent to the motor switch in step 723 and the voltage supply to the motor remains on. Motor control process 700 returns to step 701.

If the slope is not greater than or equal zero, i.e., the slope is less than zero, then an acceleration of the curve P(x) at the most recent data point is determined in step 724 by:

$$\left. \frac{d^2 P}{dx^2} \right|_{x_n}. \quad [21]$$

In step 725, a determination of whether the acceleration of the curve is less than or equal to zero is made.

If the acceleration is less than or equal to zero, then a predicted RPM of the motor on the next revolution is calculated in step 726 by solving:

$$(x - x_n)P(x) - 60 = 0, \text{ and} \quad [22]$$

$$\tilde{y} := \frac{60}{\tilde{x} - x_n}, \quad [23]$$

where $\tilde{x}$ solves equation [22] and $\tilde{y}$ is the predicted RPM.

If the acceleration is not less than or equal to zero, i.e., the acceleration is greater than zero, then the predicted RPM of the motor on the next revolution is calculated in step 727 by:

$$(x - x_n)^2 \left. \frac{dP}{dx} \right|_{x_n} + (x - x_n)P(x_n) - 60 = 0, \text{ and} \quad [24]$$

$$\tilde{y} := \frac{60}{\tilde{x} - x_n}, \quad [25]$$

where $\tilde{x}$ solves equation [24] and $\tilde{y}$ is the predicted RPM.

In step 728, a determination of whether the predicted RPM is less than or equal to the synchronous speed calculated in step 702 is made.

If the predicted RPM is not less than or equal to the synchronous speed, i.e., the predicted RPM is greater than the synchronous speed, then a null command is sent to the motor switch in step 729 and the voltage supply to the motor remains off.

If the predicted RPM is less than or equal to the synchronous speed, then a command to turn the voltage supply to the motor on is sent to the motor switch in step 730.

In step 717, a new previous time increment and a new previous RPM is recorded. Motor control process 700 returns to step 701.

In a preferred embodiment, the four previous time increments are determined. In other embodiments, any number of previous time increments is determined.

EXAMPLE 1

The following is an example of motor control process 700. In this example, the motor is rotating with the voltage supply to the motor applied at an RPM less than a synchronous speed of 1,200 RPM. A determination must be made whether or not the motor will be running faster than the synchronous speed at the next detected revolution before the next detected revolution occurs.

Let the time increments, in seconds, and corresponding RPMs be defined by:

$x_0 = 0$, $x_1 = 0.050675$, $x_2 = 0.101181$, and $x_3 = 0.151432$, $y_1 = 1184$, $y_2 = 1188$, and $y_3 = 1194$.

Thus, $$P(x) = 1182.03 + 18.612x + 398.982x^2, \quad [26]$$

$$\frac{dP}{dx} = 18.612 + 797.965x, \text{ and} \quad [27]$$

$$\frac{d^2 P}{dx^2} = 797.965. \quad [28]$$

Therefore, at $x_3$:

$$\left. \frac{dP}{dx} \right|_{x_3} > 0 \text{ and } \left. \frac{d^2 P}{dx^2} \right|_{x_3} > 0. \quad [29]$$

Since $y_3 = 1194$ and $$\left. \frac{d^2 P}{dx^2} \right|_{x_3} > 0, \text{ use } \left. \frac{dP}{dx} \right|_{x_3}$$

to determine what the motor RPM will be when the motor completes its next revolution. Thus, $$(x - x_3)^2 \left. \frac{dP}{dx} \right|_{x_3} + (x - x_3)P(x_3) - 60 = 0 \quad [30]$$

is solved to obtain $\tilde{x} = 0.201392$.

This implies that $\Delta \tilde{x} = 0.04996$. Therefore, the predicted RPM is $\tilde{y} = 1200.97$. Since $\tilde{y} \geq$ the motor synchronous speed, a command is sent to the motor switch to turn the voltage supply to the motor off and motor control process 700 returns to step 701.

Figure 8:
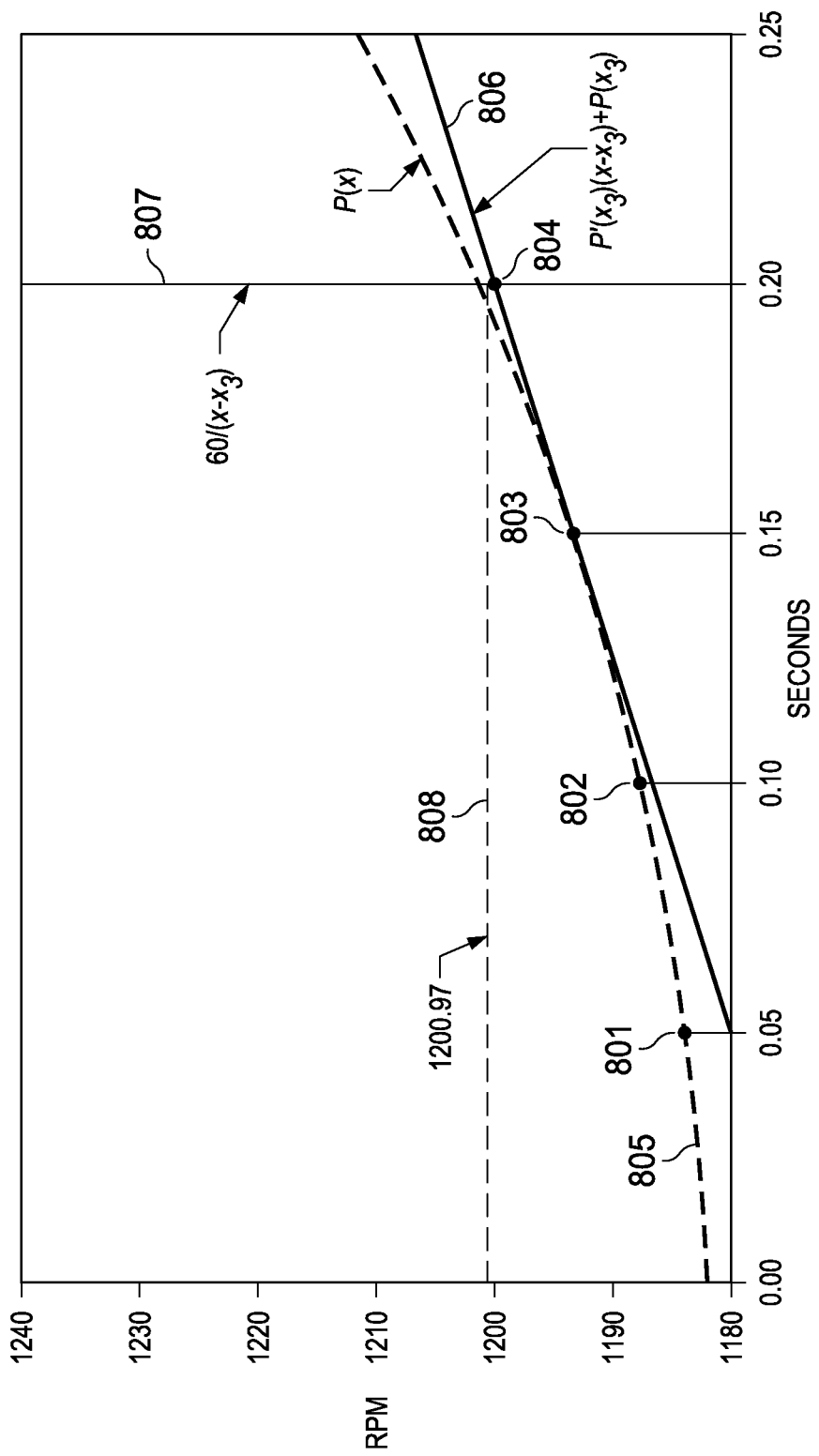
FIG. 8 is a graph of time increment and RPM data points of a motor controlled by a preferred embodiment of a motor control process.

Referring to FIG. 8 by way of example, an exemplary plot of RPM and time increments calculated from Example 1 are shown. Data point 801 is $(x_1, y_1) = (0.050675, 1184)$, data point 802 is $(x_2, y_2) = (0.101181, 1188)$ and data point 803 is $(x_3, y_3) = (0.151432, 1194)$. Solution point 804 is $(\tilde{x}, \tilde{y}) = (0.201392, 1200.97)$ calculated by equations [25] and [30], where $\tilde{x}$, 0.201392 is the predicted time increment at which the motor will have the predicted RPM and $\tilde{y}$, 1200.97 is the predicted RPM. Data points 801, 802, and 803 are plotted along curve 805. Curve 805 is P(x) as defined by equation [26].

x̃ of solution point 804 is calculated by solving for x from:

$$\frac{60}{(x-x_3)} = P'(x_3)(x-x_3) + P(x_3), \quad [31]$$

where $\frac{60}{(x-x_3)}$ is curve 807 and P'(x₃)(x−x₃)+P(x₃) is curve 806.

ỹ of solution point 804 is calculated by:

$$\tilde{y} := \frac{60}{\tilde{x} - x_n}. \quad [32]$$

Solution point 804 is plotted at the intersection of curves 806 and 807.

Figure 9:
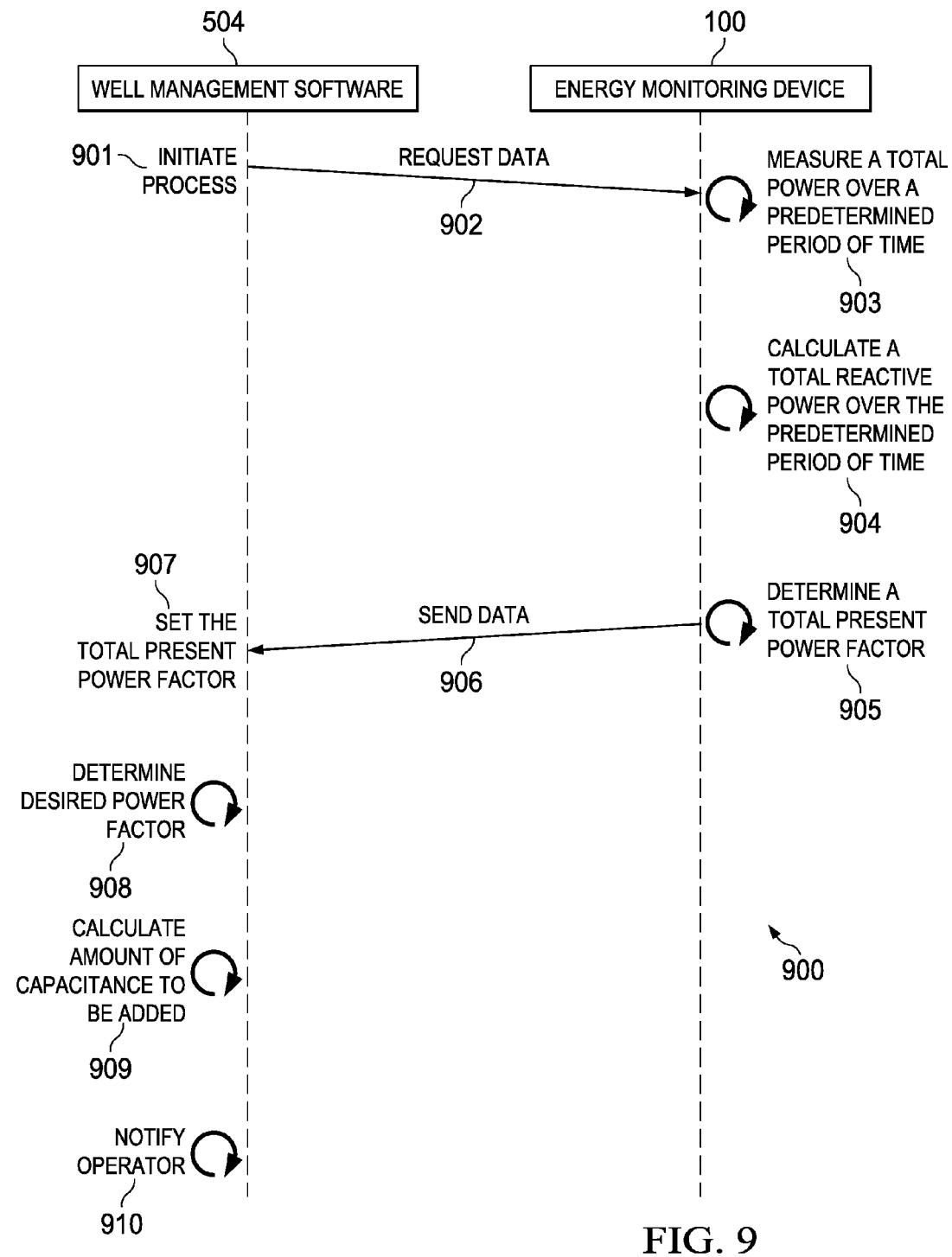
FIG. 9 is a flow chart of a preferred embodiment of a data acquisition process.

Referring to FIG. 9, data acquisition process 900 for correcting a power factor of a motor connected to a power supply, the motor powering a rod pumping system, is described. Well management software 504 initiates data acquisition process 900 in step 901. In step 902, well management software 504 requests data from energy monitoring device 100.

In step 903, a total power over a predetermined period of time is measured by energy monitoring device 100. The total power, $P_{total}$, is determined by:

$$P_{total} = \Sigma_{k=1}^{m} P_k, \quad [33]$$

where $P_k$ is the average active power in the kill phase of m phases supplied to the motor. In a preferred embodiment, the predetermined period of time is a stroke period of a rod pumping system. In another embodiment, 15 minutes is the predetermined period of time. In another embodiment, 30 minutes is the predetermined period of time. In other embodiments, any predetermined period of time is the period of time. The average active power, $P_k$, in each phase of the motor is determined by:

$$P_k = \left( C_k \frac{\sum_{j=1}^{s} v_{k,j} \cdot i_{k,j}}{s} \right), \quad [34]$$

where $P_k$ is the average active power in the kth phase, over s measured samples, $C_k$ is the scaling factor for the kth phase, $v_{kj}$ is the instantaneous voltage, and $i_{kj}$ is the instantaneous current. The instantaneous voltage and current are each measured by energy monitoring device 100.

In step 904, a total reactive power, $Q_{total}$, is calculated over the predetermined period of time. The total reactive power is defined by:

$$Q_{total} = \Sigma_{k=1}^{m} Q_k, \quad [35]$$

where $Q_k$ in the kth phase of m phases supplied to the motor, and $$Q_k = C_k \frac{\sum_{j=1}^{s} \tilde{v}_{k,j} \cdot i_{k,j}}{s}, \quad [36]$$

where $Q_k$ is the average reactive power in the kth phase, over s samples, $C_k$ is the scaling factor for the kth phase, $V_{kj}$ is the instantaneous voltage for the kth phase at the jth sample shifted by 90 degrees, and $i_{kj}$ is the instantaneous current. The instantaneous voltage and current are each measured by energy monitoring device 100.

In step 905, a total present power factor of the motor is determined by:

$$F_p = \frac{P_{total}}{S}, \quad [37]$$

where $F_p$ is the total present power factor over the predetermined period of time, P is the total power over the predetermined period of time, and S is the apparent power. The apparent power S is determined by:

$$S = \sqrt{P_{total}^2 + Q_{total}^2}, \quad [38]$$

where S is the apparent power, $P_{total}$ is the total active power, and $Q_{total}$ is the total reactive power.

In step 906, the data calculated in steps 903, 904, and 905 are sent from energy monitoring device 100 to well management software 504.

In step 907, the total present power factor $F_p$ is set into a database.

In step 908, a desired power factor $F_d$ is determined and manually entered into well management software 504. In a preferred embodiment, the desired power factor is 0.95 and the present power factor is less than the desired power factor. Other desired power factor values may be used.

In step 909, an amount of capacitance needed to be added to each phase of the motor to correct the power factor of the motor is calculated by:

$$C_{added} = Q_{total} - P_{total} \tan(\cos^{-1}(F_d)). \quad [39]$$

In step 910, well management software 504 notifies an operator. In one embodiment, the notification is a pop-up notification. In another embodiment, the notification is an e-mail message. In another embodiment, the notification is an SMS message. In another embodiment, the notification is a MMS message. Other notifications known in the art may be employed.

Figure 10A:
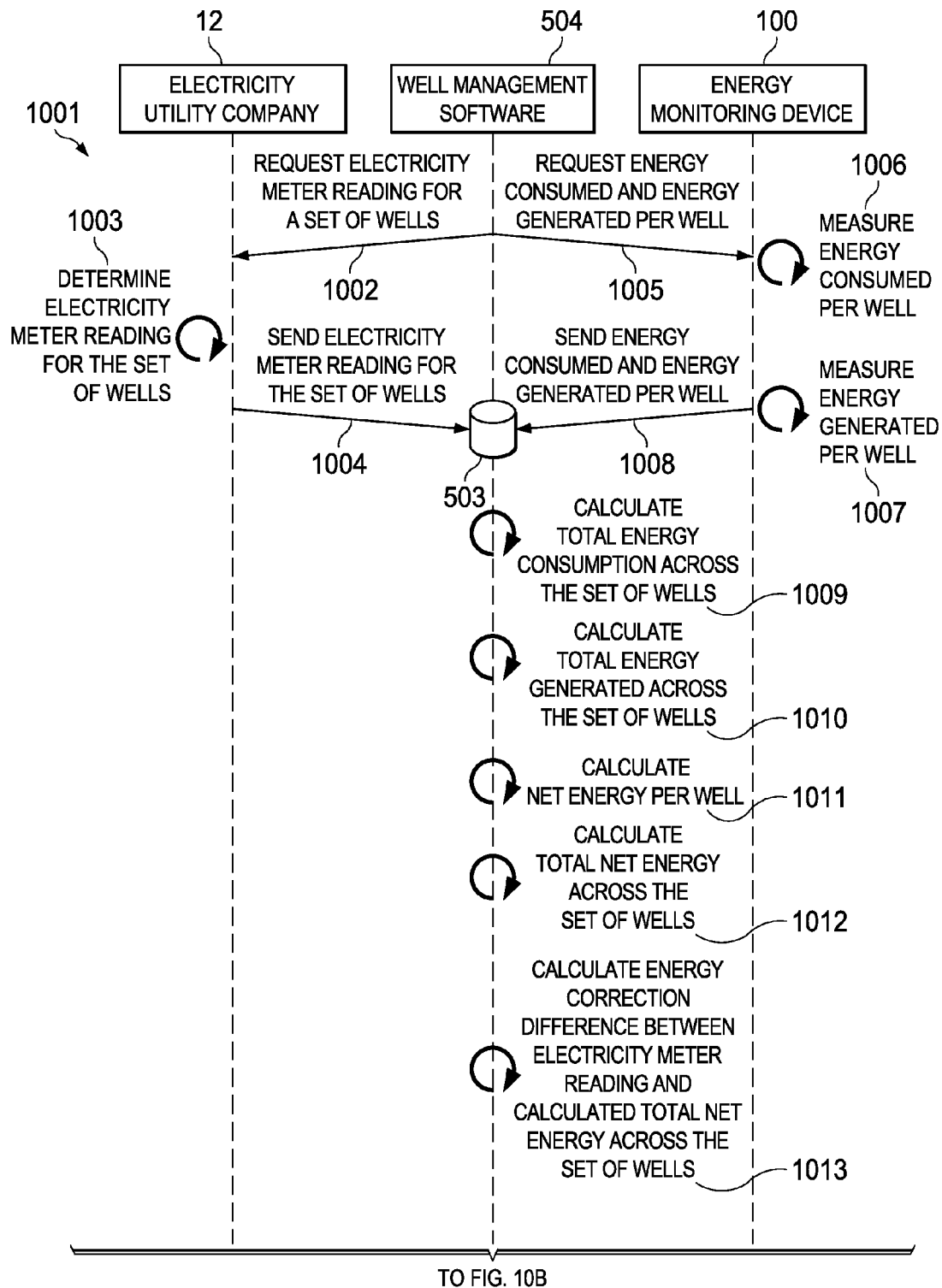
FIG. 10A is a partial flow chart of a preferred embodiment of a data acquisition process.
Figure 10B:
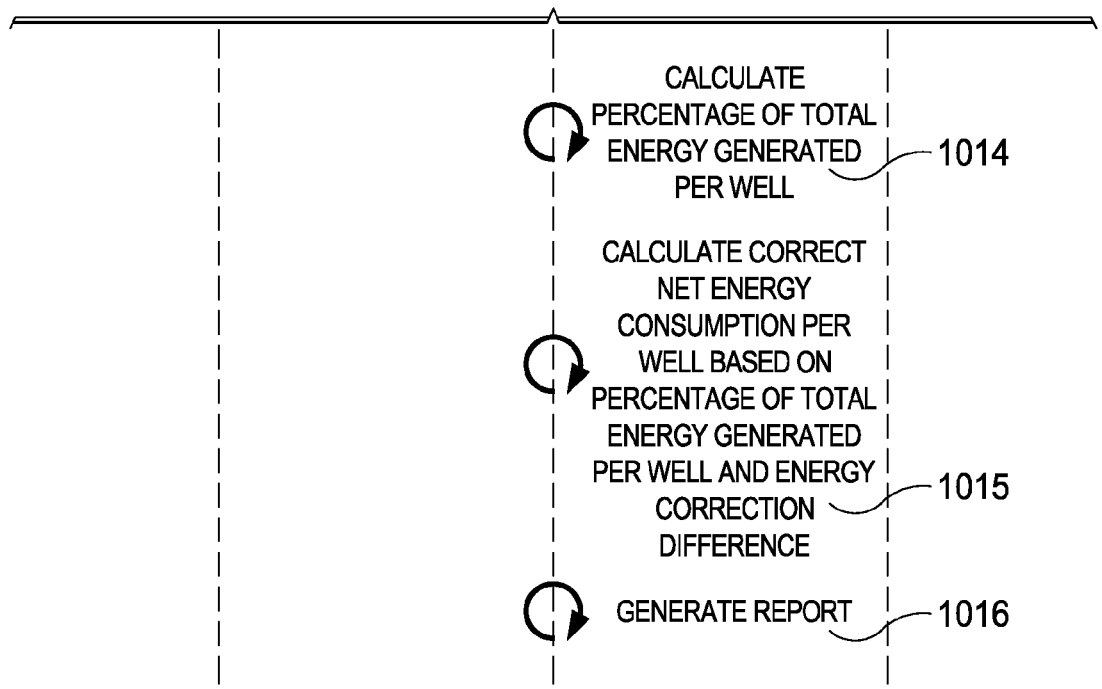
FIG. 10B is a partial flow chart of a preferred embodiment of a data acquisition process.

Referring to FIGS. 10A and 10B, data acquisition process 1001 for allocating energy consumption for a set of wells, each well utilizing a rod pumping system is described. In step 1002, well management software 504 commences data acquisition process 1001 by requesting an electricity meter reading for the set of wells for a period of time from electricity utility company 12. The electricity meter reading for the set of wells is determined by electricity utility company 12 for the period of time in step 1003. The electricity meter reading includes a total energy consumption and a power factor for the set of wells. In a preferred embodiment, the period of time is a stroke period of a rod pumping system. In another embodiment, 15 minutes is the period of time. In another embodiment, 30 minutes is the period of time. In another embodiment, an electricity utility company billing cycle is the period of time. In other embodiments, any predetermined period of time is the period of time.

In step 1004, electricity utility company 12 sends the electricity meter reading for the set of wells to well management software 504 to be saved in database 503.

In step 1005, well management software 504 requests an amount of energy consumed per well for the period of time from energy monitoring device 100. In step 1006, energy monitoring device 100 measures the amount of energy consumed per well for the period of time. In step 1007, an amount of energy generated per well for the period of time is measured with the energy monitoring device 100. Energy monitoring device 100 sends the energy consumed per well and the energy generated per well to well management software 504 to be saved in database 503 in step 1008. In step 1009, a total amount of energy consumption across the set of wells for the period of time is calculated by well management software 504. In step 1010, well management software 504 calculates a total amount of energy generated across the set of wells for the period of time. In step 1011, well management software 504 calculates an amount of net energy for the period of time by computing the difference between the amount of energy consumed per well and the amount of energy generated per well. In step 1012, well management software 504 calculates an amount of total net energy across the set of wells for the period of by adding the amounts calculated in step 1011. In step 1013, well management software 504 calculates an energy correction difference between the total energy consumption reading determined from electricity utility company 12 and the amount of total net energy across the set of wells from step 1012 for the period of time. The energy correction difference is the amount of total generated energy lost by w number of rod pumping systems at the set of wells for the period of time and must be allocated among the set of wells. In step 1014, well management software 504 calculates a percentage of the amount of total energy generated is calculated for each of the set of wells. In step 1015, well management software 504 calculates a correct amount of net energy per well for each of the set of wells for the period of time based on the percentage of the total energy generated per well and the energy correction difference calculated in step 1013. In step 1016, well management software 504 generates a report using values calculated in data acquisition process 1001.

EXAMPLE 2

As an example of data acquisition process 1001 of FIGS. 10A and 10B, well A, well B, and well C are connected to a single electricity meter that measures the energy consumed for wells A, B, and C. For a period of time, the electricity meter reading is determined to be 14379.52 kWh in step 1003. In step 1006, the amount of energy consumed for per well is measured: 5000 kWh for well A, 6400 kWh for well B, and 4200 kWh for well C. In step 1007, the amount of energy generated per well is measured: 1200 kWh for well A, 200 kWh for well B, and 200 kWh for well C. In step 1009, the total amount of energy consumed of 15600 kWh for wells A, B, and C is calculated. In step 1010, the total amount of energy generated of 1600 kWh for wells A, B, and C is calculated. In step 1011, the net energy for each of the set of wells is calculated: 3800 kWh for well A, 6200 kWh for well B, and 4000 kWh for well C. In step 1012, the total net energy across the set of wells is calculated as 14000 kWh. In step 1013, an energy correction difference of 379.52 kWh between the total energy consumption reading from step 1003, 14379.52 kWh, and the amount of total net energy across the set of wells from step 1012, 14000 kWh, is calculated. In step 1014, the percentage of the amount of total energy generated is calculated for each of the set of wells: 75% for well A, 12.5% for well B, and 12.5% for well C. In step 1015, the energy correction amount of net energy per well is calculated for each of the set of wells based on the percentage of the total energy generated per well and the energy correction difference calculated in step 1013. For well A, the energy correction amount is 284.64 kWh, 75% of 379.52 kWh, resulting in a total corrected net energy allocation of 4084.64 kWh consumed. For well B, the energy correction amount is 47.44 kWh, 12.5% of 379.52 kWh, resulting in a total corrected net energy allocation of 6247.44 kWh consumed. For well C, the energy correction amount is 47.44 kWh, 12.5% of 379.52 kWh, resulting in a total corrected net energy allocation of 4047.44 kWh. As a result, each well is allocated a correct amount of energy consumed for a time period and enabling each well to be billed for energy consumption more accurately. Table 1 below is an example of a report generated in step 1016.

TABLE 1

Example of Well Energy Allocation

| Energy | Well A | Well B | Well C | Total |
|---|---|---|---|---|
| Energy Consumed (kWh) | 5000 | 6400 | 4200 | 15600 |
| Energy Generated (kWh) | 1200 | 200 | 200 | 1600 |
| Net Energy (kWh) | 3800 | 6200 | 4000 | 14000 |
| Percentage of Total Energy Generated | 75% | 12.5% | 12.5% | 100% |
| Allocation from Electricity Meter (kWh) | 4793.17 | 4793.17 | 4793.17 | 14379.52 |
| Energy Correction | 284.64 | 47.44 | 47.44 | 379.52 |
| Total Corrected Allocation (kWh) | 4084.64 | 6247.44 | 4047.44 | 14379.52 |

EXAMPLE 3

In another useful example, the report generated in step 1016 and shown in Table 1 can be used to negotiate a lower electricity bill. Typically, electricity utility companies set electricity price rates throughout a day by a statistical demand curve with higher demand in the middle of the day and lower demand at night. Thus, the statistical curve results in higher electricity rates in the middle of the day and lower electricity rates at night. A customer of an electricity utility company operating a set of wells can use the data from the report in Table 1 to show the electricity utility company that the demand of the set of wells does not follow the statistical demand curve and can negotiate a lower price resulting in a lower electricity bill and thereby a savings in operating costs to the customer.

Figure 11B:
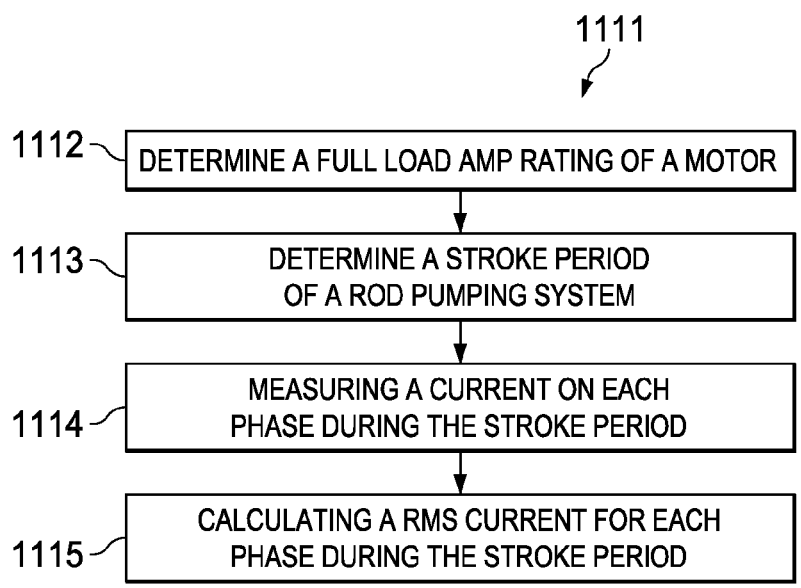
FIG. 11B is a flow chart of a preferred embodiment of a data measurement process.
Figure 11A:
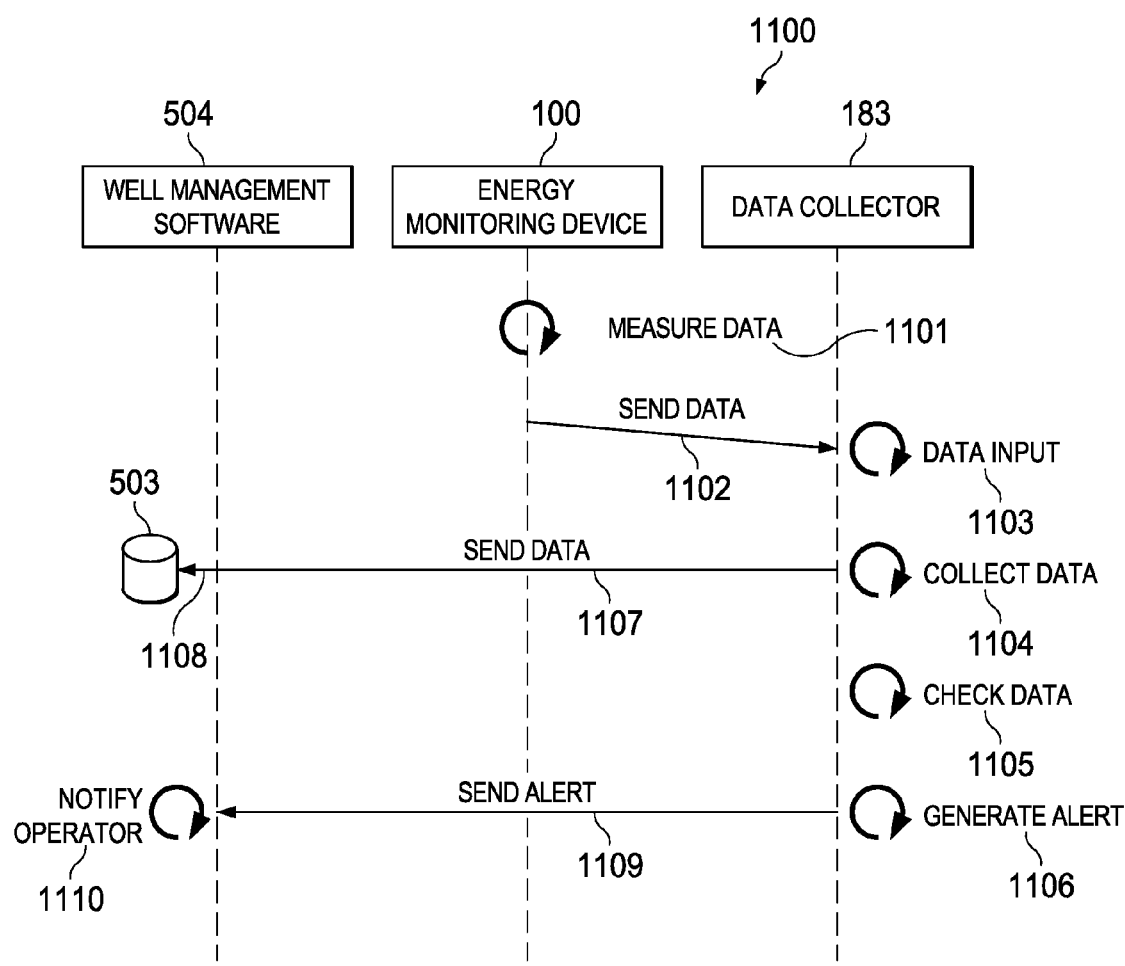
FIG. 11A is a flow chart of a preferred embodiment of an alert generation process.

Referring to FIG. 11A, alert generation process 1100 is described. Energy monitoring device 100 constantly measures data in step 1101. For example, the measurements include, but are not limited to energy consumed, energy generated, voltage, current, RMS current, peak demand, continuous demand for a period of 15 minutes, peak demand for periods of 15 minutes over a 24 hour period, and peak current of motor 22, and load of polished rod 30. In one embodiment, if the energy measured by microprocessor 108 exceeds a predetermined threshold for energy generated by motor 22 in the first, second, or third phase, then microprocessor 108 powers red indicators 120, 121, and 124, respectively and sends a set of pulses to data collector 183. In a preferred embodiment, the set of pulses are generated and sent with one pulse for every 10 kilowatt-hours generated. In another embodiment, if the energy measured by microprocessor 108 exceeds a predetermined threshold for energy consumed by motor 22 in the first, second, or third phase, then microprocessor 108 powers green indicators 125, 126, and 127, respectively and sends a set of pulses to data collector 183. In a preferred embodiment, the set of pulses are generated and sent with one pulse for every 10 kilowatt-hours consumed. In step 1102, energy monitoring device 100 sends the data to data collector 183. In step 1103, data collector 183 saves the data input to memory. In step 1104, data collector collects the saved data. As data is collected in step 1104, data collector 183 sends the collected data to well management software 504 in step 1107 to be saved in database 503 in step 1108. In step 1105, the collected data is checked as to whether the collected data is beyond a predetermined threshold for that set of data. If the collected data is beyond a predetermined threshold in step 1105, then an alert is generated in step 1106 by data collector 183. If the collected data is not beyond the predetermined threshold then data acquisition process 1100 returns to step 1104 and keeps collecting data. In step 1109, data collector 183 sends the alert to well management software 504 and well management software 504 notifies an operator of the alert in step 1110. In one embodiment, the notification is a pop-up notification. In another embodiment, the notification is an e-mail message. In another embodiment, the notification is an SMS message. In another embodiment, the notification is a MMS message. Other notifications known in the art may be employed.

Referring to FIGS. 11A and 11B by way of example of data measurement step 1001 in FIG. 11A, data acquisition process 1111 for determining an electrical loading of a motor having a plurality of phases, powering a rod pumping system is described. In step 1112, a full load amp rating of the motor is determined representing a predetermined threshold. In step 1113, a stroke period of a rod pumping system is determined. A current on each of the plurality of phases during the stroke period is measured in step 1114. In step 1115, an RMS current for each of the plurality of phases of the motor during the stroke period is calculated. The RMS current for each of the plurality of phases of the stroke period is then sent to data collector 183 in step 1102. In step 1103, data collector saves the RMS current for each of the plurality of phases of the stroke period to memory. In step 1104, the RMS current data is collected from memory. In step 1105, data collector 183 runs a data check on the saved the RMS current for each of the plurality of phases of the stroke period. In step 1105, a threshold determination of whether any of the RMS currents for each of the plurality of phases is greater than or equal to the full load amp rating is made. If any of the RMS currents for each of the plurality of phases is greater than or equal to the full load amp rating, then an alert is generated for the RMS current for the phase in step 1106 and sent to well management software 504 in step 1109 and an operator is notified in 1110. In step 1105, if none of the RMS currents are greater than or equal to the full load amp rating, i.e., all of the RMS currents are less than the full load amp rating, then data acquisition process 1100 returns to step 1104.

It will be appreciated by those skilled in the art that modifications can be made to the embodiments disclosed and remain within the inventive concept. Therefore, this invention is not limited to the specific embodiments disclosed, but is intended to cover changes within the scope and spirit of the claims.

The invention claimed is:

1. A system comprising:
   a network server having a processor;
   a set of energy monitoring devices connected to the network server, each energy monitoring device in communication with the well management software;
   a set of wells connected to the set of energy monitoring devices, an electricity meter connected to the set of wells and to the set of energy monitoring devices;
   the processor programmed to:
   send a request for an electricity meter reading for a period of time between the well management software and an electricity utility company;
   receive the electricity meter reading between the electricity utility company and the well management software;
   send a request for an amount of energy consumed per well and an amount of energy generated per well for the period of time between the well management software and the set of energy monitoring devices;
   measure an amount of energy consumed by each of the set of wells for the period of time;
   measure an amount of energy generated by each of the set of wells for the period of time;
   send the amount of energy consumed by each of the set of wells for the period of time and the amount of energy generated by each of the set of wells for the period of time between the set of energy monitoring devices and the well management software;
   calculate a total energy consumption for the set of wells for the period of time;
   calculate a total energy generated for the set of wells for the period of time;
   calculate a net energy for each of the set of wells for the period of time;
   calculate a total net energy for the set of wells for the period of time;
   calculate an energy correction difference between the electricity meter reading and the calculated total net energy for the set of wells for the period of time;
   calculate a percentage of the total energy generated for each of the set of wells; and
   calculate a correct net energy consumption for each of the set of wells for the period of time.

2. The system of claim 1, wherein the processor is further programmed to:
   generate a report.

3. The system of claim 1, wherein the processor is further programmed to:
   provide a stroke period of the set of wells as the period of time.

4. The system of claim 1, wherein the processor is further programmed to:
   Provide a billing cycle of the electricity utility company as the period of time.

5. A system for allocating energy consumption and energy generation for a set of wells connected to an electricity meter connected to an electricity utility company having a first processor and a first memory, the electricity meter powering the set of wells, comprising:
   a network server having a second processor, a second memory, and a well management software saved into the second memory and executed by the second processor;
   a set of energy monitoring devices, each energy monitoring device having a third processor and a third memory connected to the network server and in communication with the well management software;

the set of energy monitoring devices connected to the set of wells;

the network server connected to the electricity utility company;

the well management software in communication with the electricity utility company;

the first processor programmed to:
- determine the electricity meter reading for the set of wells for a period of time;
- receive the electricity meter reading from the electricity utility company;

the second processor programmed to:
- send a request for the electricity meter reading for the period of time between the well management software and the electricity utility company;
- send a request for an amount of energy consumed per well and an amount of energy generated per well for the period of time between the well management software and the set of energy monitoring devices;
- calculate a total energy consumption for the set of wells for the period of time;
- calculate a total energy generated for the set of wells for the period of time;
- calculate a net energy for each of the set of wells for the period of time;
- calculate a total net energy for the set of wells for the period of time;
- calculate an energy correction difference between the electricity meter reading and the calculated total net energy for the set of wells for the period of time;
- calculate a percentage of the total energy generated for each of the set of wells;
- calculate a correct net energy consumption for each of the set of wells for the period of time;

the third processor programmed to:
- measure an amount of energy consumed by each of the set of wells for the period of time;
- measure an amount of energy generated by each of the set of wells for the period of time;
- send the amount of energy consumed by each of the set of wells for the period of time and the amount of energy generated by each of the set of wells for the period of time between the set of energy monitoring devices and the well management software.

6. The system of claim 5, wherein the second processor further programmed to generate a report.

\* \* \* \* \*